United States Patent
Kim et al.

(10) Patent No.: US 7,442,648 B2
(45) Date of Patent: Oct. 28, 2008

(54) METHOD FOR FABRICATING SEMICONDUCTOR DEVICE USING TUNGSTEN AS SACRIFICIAL HARD MASK

(75) Inventors: Kwang-Ok Kim, Ichon-shi (KR);
Yun-Seok Cho, Ichon-shi (KR);
Seung-Chan Moon, Ichon-shi (KR);
Jin-Ki Jung, Ichon-shi (KR);
Sung-Kwon Lee, Ichon-shi (KR);
Jun-Hyeub Sun, Ichon-shi (KR);
Dong-Duk Lee, Ichon-shi (KR);
Jin-Woong Kim, Ichon-shi (KR);
Gyu-Han Yoon, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 190 days.

(21) Appl. No.: 11/149,325

(22) Filed: Jun. 10, 2005

(65) Prior Publication Data
US 2006/0079093 A1    Apr. 13, 2006

(30) Foreign Application Priority Data
Oct. 12, 2004   (KR) ............... 10-2004-0081383
Dec. 28, 2004   (KR) ............... 10-2004-0113714

(51) Int. Cl.
*H01L 21/302* (2006.01)
(52) U.S. Cl. ...................... 438/706; 216/57
(58) Field of Classification Search ............. 438/706
See application file for complete search history.

(56) References Cited
U.S. PATENT DOCUMENTS

| | | | |
|---|---|---|---|
| 4,836,887 A | * | 6/1989 | Daubenspeck et al. ........ 216/72 |
| 5,851,926 A | * | 12/1998 | Kumar et al. ............... 438/714 |
| 6,037,265 A | * | 3/2000 | Mui et al. ................... 438/719 |
| 6,087,269 A | | 7/2000 | Williams |
| 6,143,654 A | | 11/2000 | Hahm et al. |
| 6,261,967 B1 | * | 7/2001 | Athavale et al. ............ 438/717 |

(Continued)

FOREIGN PATENT DOCUMENTS

CN    1469428    1/2004

(Continued)

OTHER PUBLICATIONS

Wolf et al. (Silicon Processing for the VLSI Era; vol. 1, 1989, Lattice Press).*

(Continued)

*Primary Examiner*—Keith D. Hendricks
*Assistant Examiner*—Patricia A George
(74) *Attorney, Agent, or Firm*—Finnegan, Henderson, Farabow, Garrett, & Dunner, L.L.P.

(57) ABSTRACT

The present invention relates to a method for fabricating a semiconductor device using tungsten as a sacrificial hard mask material. The method includes the steps of: forming a layer on an etch target layer; forming a photoresist pattern on the layer; etching the layer by using the photoresist pattern as an etch mask along with use of a plasma containing $CHF_3$ gas to form a sacrificial hard mask; and etching the etch target layer by using at least the sacrificial hard mask as an etch mask, thereby obtaining a predetermined pattern.

20 Claims, 20 Drawing Sheets

U.S. PATENT DOCUMENTS

| | | |
|---|---|---|
| 6,518,206 B1 | 2/2003 | Kumar et al. |
| 6,764,893 B2 * | 7/2004 | Lee et al. .................... 438/233 |
| 7,026,253 B2 * | 4/2006 | Lee ........................... 438/717 |
| 2006/0124587 A1 | 6/2006 | Lee |

FOREIGN PATENT DOCUMENTS

| | | |
|---|---|---|
| CN | 1512272 | 7/2004 |
| CN | 1522465 | 8/2004 |
| JP | 03-201529 | 3/1991 |
| KR | 10-0198600 | 2/1999 |
| KR | 10-2003-0040030 A | 5/2003 |
| KR | 2004-0057434 | 2/2004 |
| KR | 2004-0057502 | 2/2004 |
| KR | 2004-0059925 | 6/2004 |
| WO | WO 02/097852 A2 | 12/2002 |

OTHER PUBLICATIONS

Kim et al., "ID Bias Control During W/WN/POLY Gate Etching for Nano-Scale DRAM Process Integration", Dry Process International Symposium, 7 sheets, (2004).

Decision of the Intellectual Property Office from the Taiwanese Intellectual Property Office, issued Feb. 6, 2007, in Taiwanese Application No. 094115738.

Notice of Programming Rejection from the Korean Intellectual Property Office, mailed Jun. 28, 2007 in Korean Patent Application No. 2004-0081383 and English translation thereof.

* cited by examiner (A)

(B)

(C)

(A)

(B)

(C)

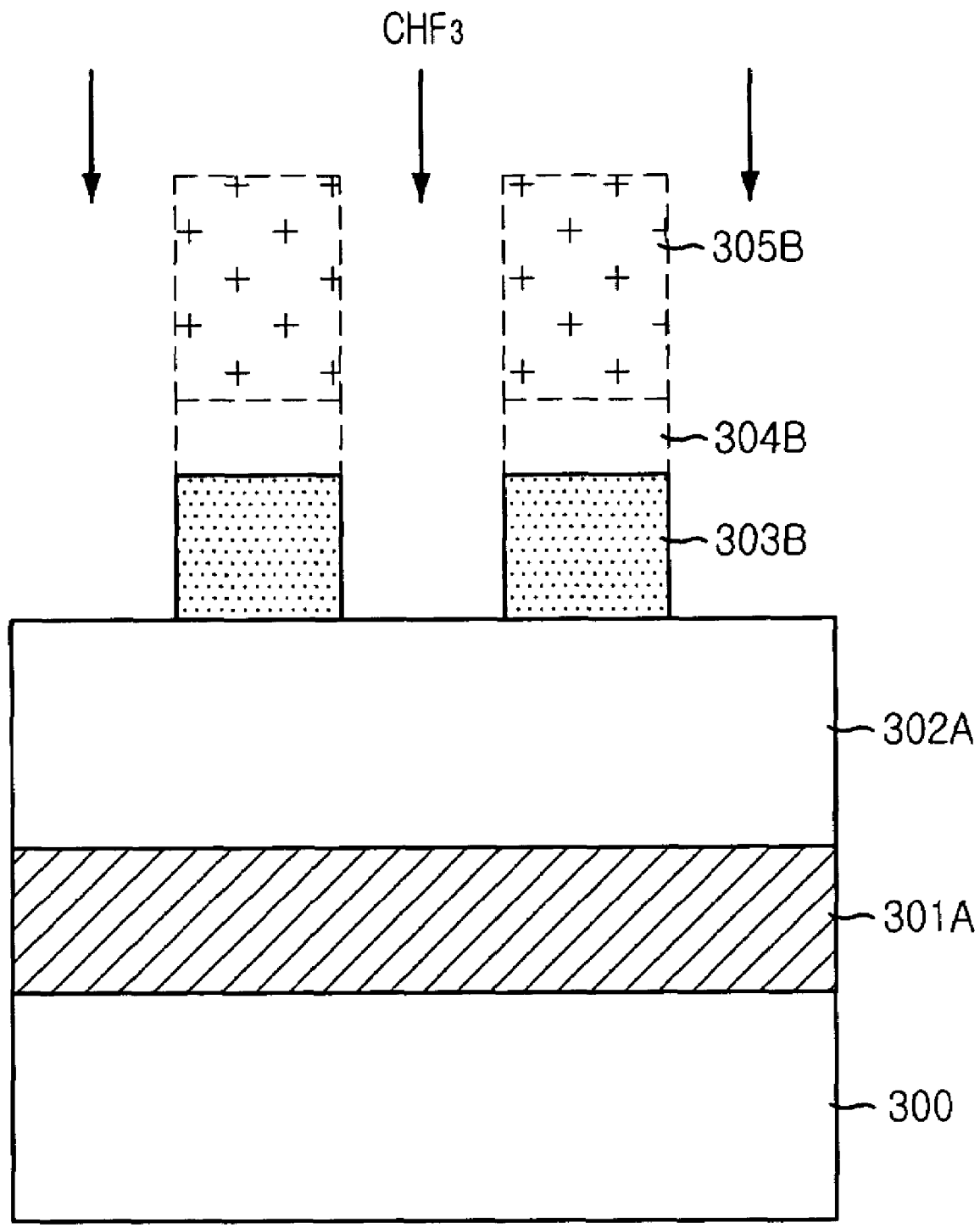

METHOD FOR FABRICATING SEMICONDUCTOR DEVICE USING TUNGSTEN AS SACRIFICIAL HARD MASK

FIELD OF THE INVENTION

The present invention relates to a method for fabricating a semiconductor device; and, more particularly, to a method for forming a pattern in a semiconductor device by using an advanced light source compared with $F_2$ and ArF.

DESCRIPTION OF RELATED ARTS

Photolithography is one advanced fine manufacturing process that has made a contribution to a current astonishing progression in semiconductor devices. Especially, an improvement on resolution of the photolithography is a critical factor for advancing an integration scale of semiconductor devices.

As known, photolithography includes a process for forming a photoresist pattern and a process for forming desired patterns like line patterns, for instance, contact holes and gate structures, by etching an etch target with use of the photoresist pattern as an etch mask. Herein, the photoresist pattern is formed through sequential processes including a process for forming a photoresist layer on the etch target, a photo-exposure process for selectively exposing the photoresist layer with use of a photo-exposure mask and a developing process for removing a photo-exposed portion or non-photo-exposed portion of the photoresist layer by using a predetermined chemical solution.

Meanwhile, a critical dimension of a pattern realized by the photolithography is determined by a type of light source with a certain wavelength employed in the photolithography because the critical dimension of the actual pattern depends on a width of the photoresist pattern formed by the photo-exposure process.

A photo-exposure apparatus for the photolithography has been progressed from an initially used stepper compatible with a light source with a wavelength of 636 nm, i.e., a g-line, and a light source of 365 nm, i.e., an i-line to a stepper using deep ultra-violet (DUV) with a wavelength of 248 nm, which is a KrF excimer laser beam, and a scanner type photo-exposure apparatus. Especially, the photolithography using DUV of 248 nm is applied to development of semiconductor devices with the size of 0.18 μm. However, this photolithography is disadvantageous in an incidence of a time delay at an initial stage of the photolithography and dependence on properties of an employed material. In order to develop semiconductor devices with the size of 0.15 μm, it is essential to develop a new photolithography method using DUV with a wavelength of 193 nm, i.e., an ArF excimer laser beam or a wavelength of 157 nm, i.e., a $F_2$ laser beam. Even if various photolithography techniques are combined to improve resolution of the above mentioned DUV photolithography, it is very difficult to obtain a pattern below the size of 0.1 μm. Therefore, there has vigorously made an attempt to discover a new light source for the photolithography process.

Such photolithography using a light source of ArF and photolithography using a light source of $F_2$ require using a specific type of photoresist that can be implemented to ArF and $F_2$. Although ArF and $F_2$ photoresists are chemically amplified photoresists as like a KrF photoresist, it is necessary to fundamentally modify a material used for forming the ArF or $F_2$ photoresist. Especially, it is difficult to develop a material for the ArF photoresist because it is not allowed to use a benzene ring which is used for the KrF and i-line photoresist to secure a tolerance to a dry etching process.

However, when the benzene ring is used for the ArF photoresist, absorption of the benzene ring is large at a wavelength of 193 nm of an ArF laser, resulting in a decrease in transparency which further brings out a problem in that a bottom portion of the photoresist is not possibly photo-exposed. Therefore, a current study has been focused to develop a photoresist material capable of securing a tolerance to a dry etching process without having the benzene ring, of having good adhesion and of being developed by using 2.38% tetramethyl ammonium hydroxide (TMAH). Most commonly used photoresist materials are based on a cycloolefin-maleic anhydride (COMA) or acrylate polymer or the combination of these two polymers. However, these mentioned polymer-based photoresist materials have a benzene ring structure.

As a result, in case of applying the KrF photolithography, there is less likely pattern deformation. However, when the ArF photolithography is applied, there are problems such as striation and pattern deformation. That is, unlike the KrF photolithography, when the ArF photolithography is employed, the ArF photoresist becomes clustered and the shape of the ArF photoresist is deformed. Also, because the ArF photoresist has a weak tolerance to a developing process and an etching process, the ArF photoresist becomes clustered at one region, thereby resulting in a severe pattern deformation. In case of a line-type pattern, the pattern deformation appears in the form of line edge roughness (LER).

In the design rule below 80 nm, a thickness of the photoresist pattern for patterning a gate structure is less than 1,500 Å, and the thickness of the photoresist pattern decreases as semiconductor devices have been scaled down. Hence, it is limited to obtain a desired level of etch selectivity of the photoresist pattern during the etching process.

For instance, in case of applying the design rule of 80 nm semiconductor technology, about 2,000 Å of a photoresist layer is formed. However, the thickness of an actually obtained photoresist pattern is about 1,600 Å. Similarly, in case of applying the design rule of 70 nm semiconductor technology, although about 1,700 Å of a photoresist layer is formed, the thickness of an actually obtained photoresist pattern is about 1,200 Å. At this time, the thickness of a target etch structure does not change even if the thickness of the photoresist pattern decreases.

To overcome the limitation in etch selectivity of the photoresist pattern used in the ArF photolithography and to minimize the pattern deformation, a method for using a tungsten-based sacrificial hard mask is suggested.

In this case, it is only necessary to secure a thickness of the photoresist pattern for etching the tungsten-based sacrificial hard mask. When the tungsten-based sacrificial hard mask is etched, a fluorine-based gas such as $SF_6$, $CF_4$ or $NF_3$ is used to etch an etch target on a chemical basis and then, nitrogen ($N_2$) is added to the fluorine-based gas for a physical etching of the tungsten-based sacrificial hard mask.

To etch the etch target layer, it is necessary to secure a certain thickness of the tungsten-based sacrificial hard mask and thus, the thickness of the tungsten-based sacrificial hard mask can be reduced up to a certain point. Since the thickness of the photoresist pattern decreases gradually as the pattern size becomes scaled down, there is still a limitation in etch selectivity of the photoresist pattern even if a usual etch recipe is applied during the etching of the tungsten-based sacrificial hard mask.

For instance, in case of the design rule of 80 nm semiconductor technology with the application of the ArF photolithography and tungsten-based sacrificial hard mask, after a mask process and an etching process, a critical dimension (CD) bias in a peripheral region which is called an isolation/dense (ID) bias increases by 40 nm when it is determined that a CD bias in a cell region is 0. A final CD of a pattern formed in the peripheral region for driving cells is 130 nm and, it is difficult to operate devices when the final CD of the pattern after the etching process is 150 nm.

It is also difficult to control simultaneously the cell region and the peripheral region during the mask process, and thus, if the cell region is set to accord with a target CD, the peripheral region is defined by the use of a reticle.

FIG. 1A shows diagrams exhibiting a change in an amount of an etch target when a bias power of 15 W is applied during a conventional etching process. FIG. 1B shows diagrams exhibiting a change in an amount of an etch target when a bias power of 30 W is applied during a conventional etching process.

The sections (A), (B) and (C) of FIGS. 1A and 1B represent the cases of 50% less amount of the etch target, 100% amount of the etch target and 150% over-etch amount of the etch target, respectively. Herein, reference denotations 10, 12 and 14 denote a photoresist pattern for use in ArF photolithography, a tungsten-based sacrificial hard mask and a hard mask made of $SiN_x$.

When the etch amount of the etch target is changed by varying the bias power during the etching process, especially for forming the tungsten-based sacrificial hard mask 12, a CD and size of the ArF photoresist pattern decrease. Unlike a CD in the cell region, a CD in the peripheral region is not dense, rather isolated. Thus, there is a problem in that a final CD of the etch target becomes larger than the desired CD. Also, there is a limitation in decreasing a CD of a reticle applied in the peripheral region. If the CD of the peripheral region is too small, a mask patterning process is not realizable, and on the other hand, if the ID bias is reduced, it is difficult to realize an intended level of devices.

SUMMARY OF THE INVENTION

It is, therefore, an object of the present invention to provide a method for fabricating a semiconductor device using a tungsten-based sacrificial hard mask capable of minimizing pattern deformation by increasing etch selectivity between the tungsten-based sacrificial hard mask and a photoresist pattern and preventing an isolation/dense (ID) bias in a peripheral region from increasing.

In accordance with an aspect of the present invention, there is provided a method for fabricating a semiconductor device, including the steps of: forming a layer on an etch target layer; forming a photoresist pattern on the layer; etching the layer by using the photoresist pattern as an etch mask along with use of a plasma containing $CHF_3$ gas to form a sacrificial hard mask; and etching the etch target layer by using at least the sacrificial hard mask as an etch mask, thereby obtaining a predetermined pattern.

In accordance with another aspect of the present invention, there is provided a method for fabricating a semiconductor device, including the steps of: forming a tungsten-based layer on an etch target layer; forming an anti-reflective coating layer on the tungsten-based layer; forming a photoresist pattern on the anti-reflective coating layer; etching the anti-reflective coating layer by using the photoresist pattern as an etch mask; etching the tungsten-based layer by using at least the photoresist pattern as an etch mask along with use of a plasma containing $CHF_3$ gas to form a sacrificial hard mask; and etching the etch target layer by using at least the sacrificial hard mask as an etch mask, thereby obtaining a predetermined pattern.

In accordance with still another aspect of the present invention, there is provided a method for fabricating a semiconductor device, including the steps of: forming a conductive layer on a substrate; forming an insulation layer on the conductive layer; forming a tungsten-based layer on the insulation layer; forming a photoresist pattern on the tungsten-based layer; etching the tungsten-based layer by using the photoresist pattern as an etch mask to form a sacrificial hard mask; etching the insulation layer by using at least the sacrificial hard mask as an etch mask along with a plasma containing oxygen gas to form a hard mask; and etching the conductive layer by using at least the sacrificial hard mask as an etch mask to form a conductive pattern, wherein the conductive pattern includes a stack structure of the hard mask and the conductive layer.

In accordance with further aspect of the present invention, there is provided a method for fabricating a semiconductor device, including the steps of: forming a conductive layer on a substrate; forming an insulation layer on the conductive layer; forming a tungsten-based layer on the insulation layer; forming an anti-reflective coating layer on the tungsten-based layer; forming a photoresist pattern on the anti-reflective coating layer; etching the anti-reflective coating layer by using the photoresist pattern as an etch mask; etching the tungsten-based layer by using at least the photoresist pattern as an etch mask to form a sacrificial hard mask; etching the insulation layer by using at least the sacrificial hard mask as an etch mask along with use of a plasma containing $O_2$ gas to form a hard mask; and etching the conductive layer by using at least the sacrificial hard mask as an etch mask to form a conductive pattern including a stack structure of the hard mask and the conductive layer.

BRIEF DESCRIPTION OF THE DRAWINGS

The above and other objects and features of the present invention will become better understood with respect to the following description of the preferred embodiments given in conjunction with the accompanying drawings, in which:

FIGS. 5A to 5E are cross-sectional views illustrating a method for forming a conductive pattern in a semiconductor device by employing one of ArF photolithography and $F_2$ photolithography in accordance with a second embodiment of the present invention;

DETAILED DESCRIPTION OF THE INVENTION

A method for fabricating a semiconductor device using tungsten as a sacrificial hard mask in accordance with a preferred embodiment of the present invention will be described in detail with reference to the accompanying drawings.

Figure 1A:
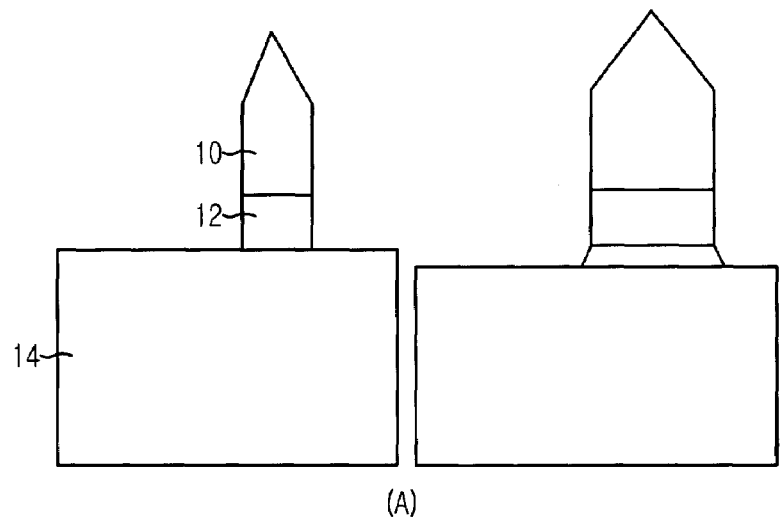
FIG. 1A shows diagrams exhibiting a change in an amount of an etch target when a bias power of 15 W is applied during a conventional dry etching process.
Figure 1A:
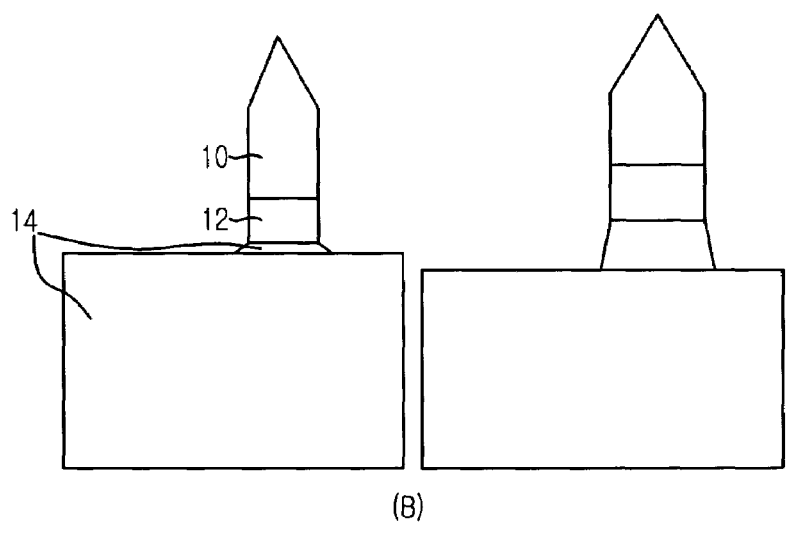
Figure 1A:
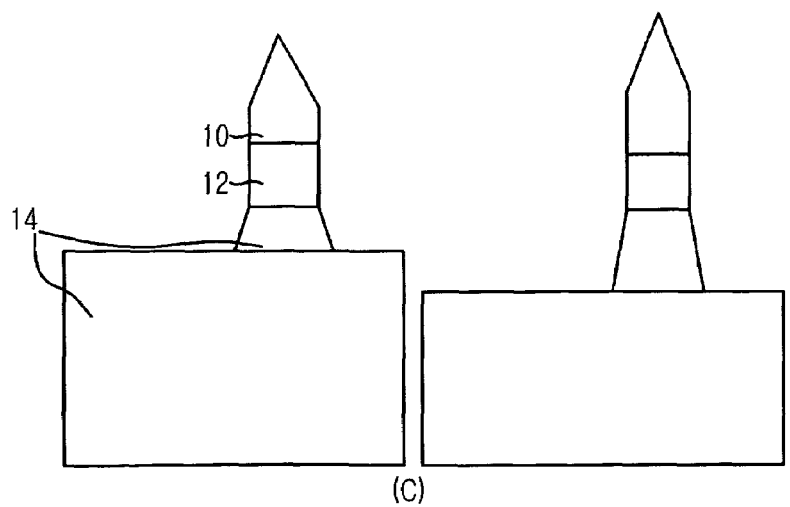
Figure 1B:
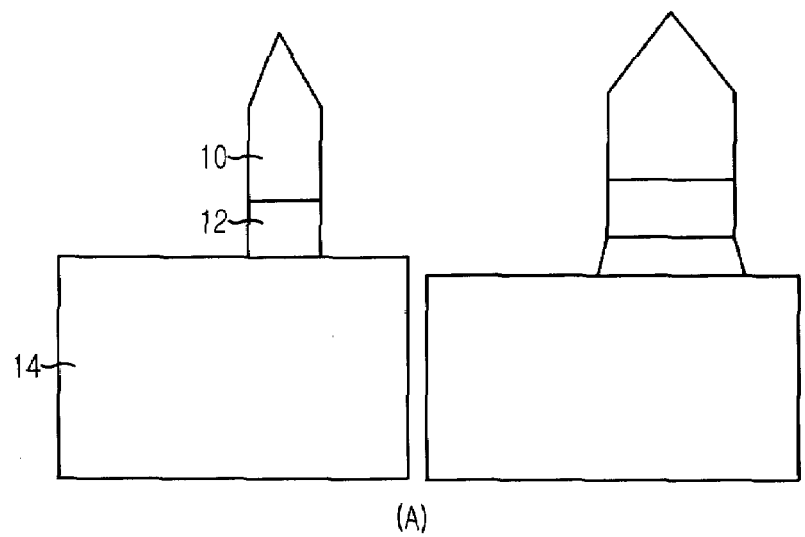
FIG. 1B shows diagrams exhibiting a change in an amount of an etch target when a bias power of 30 W is applied during a conventional dry etching process.
Figure 1B:
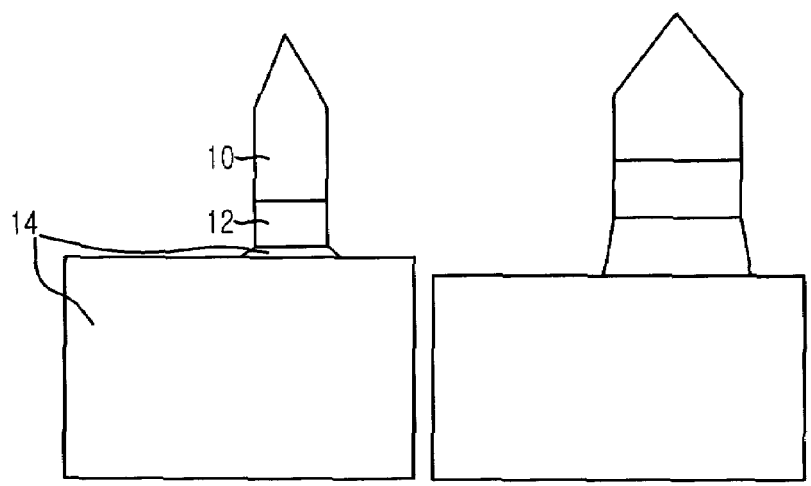
Figure 1B:
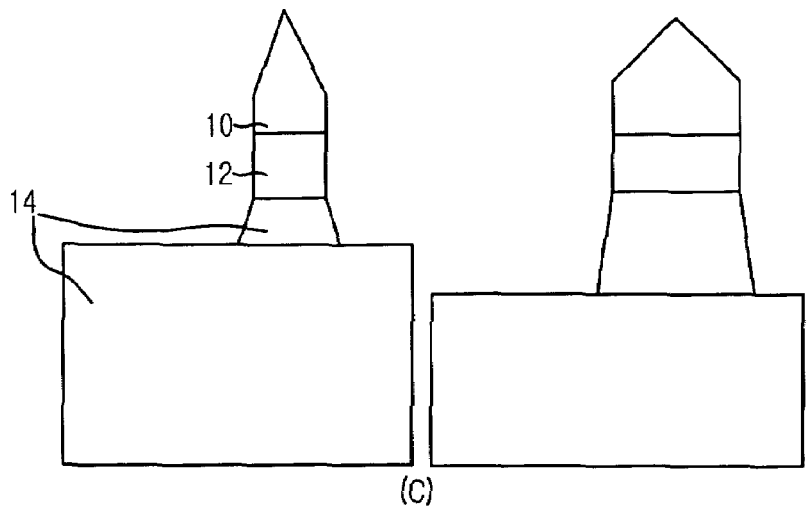
Figure 2:
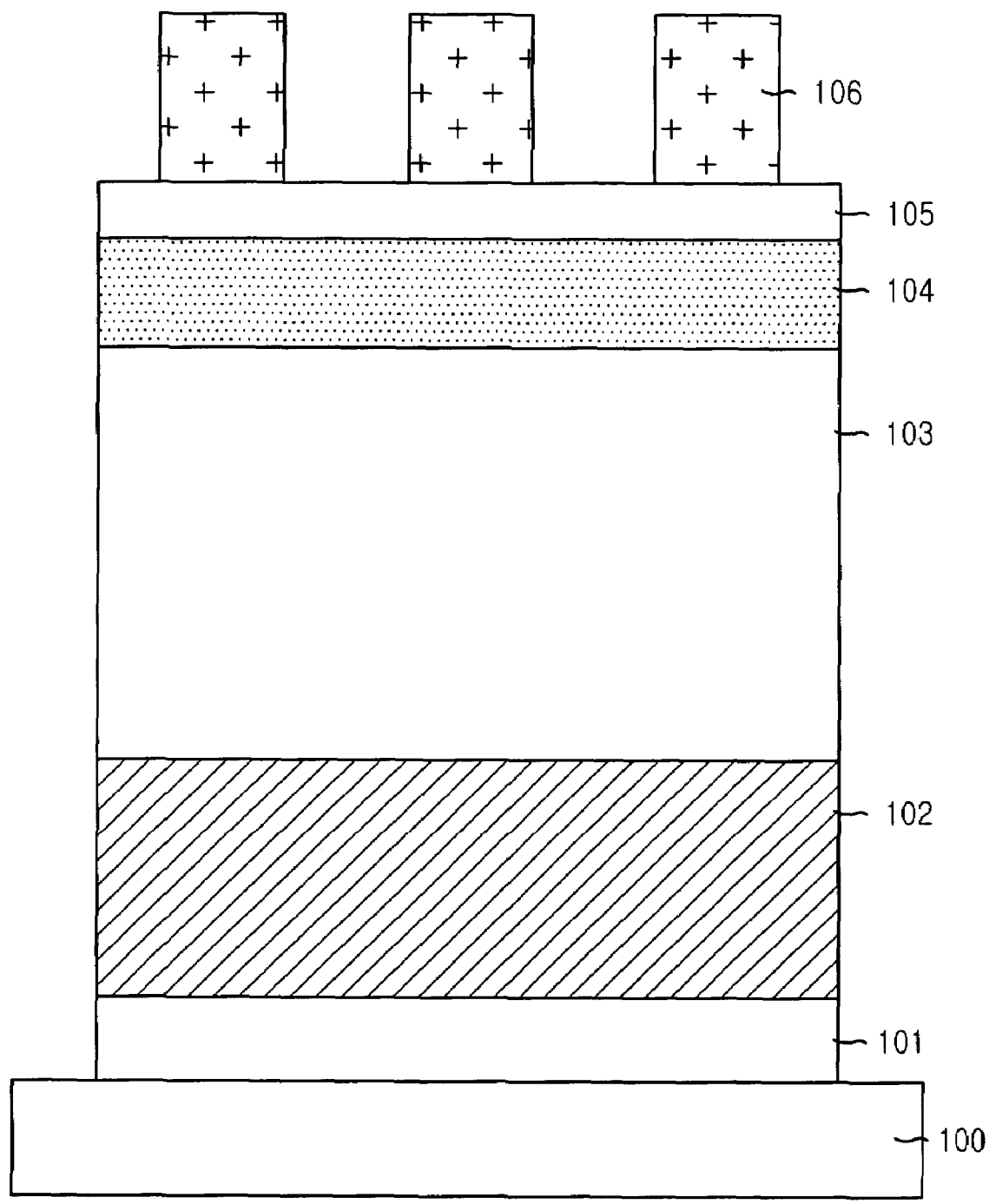
FIG. 2 is a cross-sectional view showing a photoresist pattern for forming a gate structure with use of a tungsten-based sacrificial hard mask in accordance with the present invention.

FIG. 2 is a cross-sectional view showing a photoresist pattern for forming a gate structure with use of a tungsten-based sacrificial hard mask.

As shown, a gate insulation layer 101, a gate conductive layer 102 and a nitride layer 103 for use in a hard mask are sequentially formed a substrate 100. On the nitride layer 103, a tungsten layer 104 for use in a sacrificial hard mask, an anti-reflective coating layer 105 and a photoresist pattern 106 are formed sequentially.

For formation of a gate structure, the tungsten layer 104 is etched with use of the photoresist pattern 106 as an etch mask, thereby forming a sacrificial hard mask which is subsequently used as an etch mask for etching bottom etch target layers.

FIGS. 3A to 3E are cross-sectional views showing a method for forming conductive patterns in a semiconductor device with use of $F_2$ or ArF photolithography in accordance with a first embodiment of the present invention.

Hereinafter, a bit line formation process is exemplified as one example of the conductive patterns. Also, in this first embodiment, the above conductive pattern is a line type. In addition to this line type conductive pattern, it is still possible to use an island type, a hole or donut type as like the shape of a storage node contact. Also, it is possible to form the pattern by using an insulation layer instead of the conductive layer. It is also noted that the pattern formed by the first embodiment of the present invention is a positive pattern.

Figure 3A:
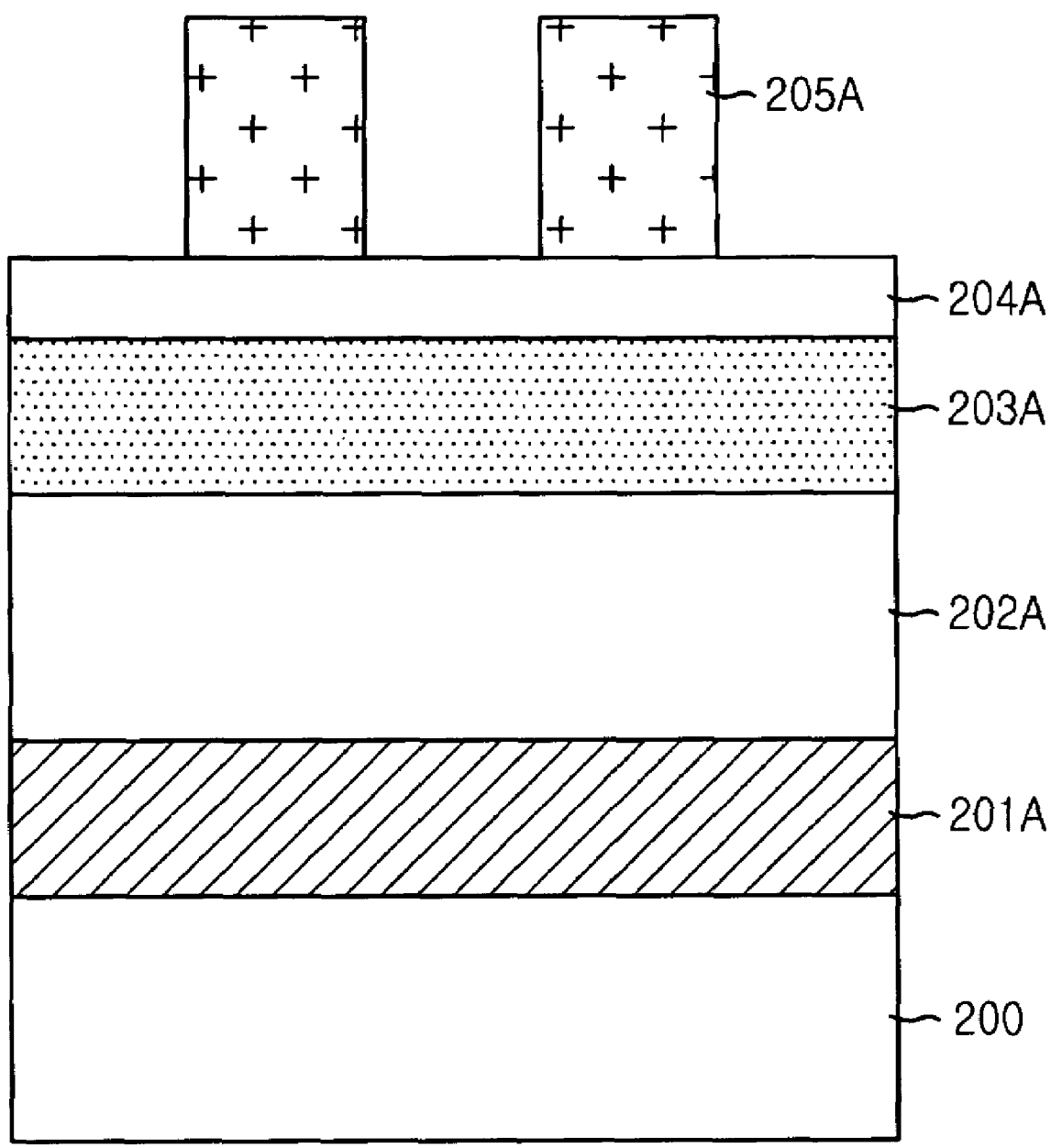
FIGS. 3A to 3E are cross-sectional views showing a method for forming a conductive pattern in a semiconductor device by employing one of ArF photolithography and $F_2$ photolithography in accordance with a first embodiment of the present invention.

Referring to FIG. 3A, a conductive layer 201A which is an etch target layer is formed on a substrate 200 provided with various device elements. Then, an insulation layer 202A for use in a hard mask is formed by using a material that has an insulation property and specific etch selectivity with respect to an etch target, i.e., the conductive layer 201A. That is, a nitride-based material such as silicon nitride ($Si_3N_4$) or silicon oxynitride (SiON) or, an oxide-based material such as silicon oxide ($SiO_2$) is employed for the insulation layer.

Next, a tungsten layer 203A for use in a sacrificial hard mask is formed on the insulation layer 202A in order to prevent pattern deformation caused by losses of the insulation layer 202A during an etching process. At this time, the tungsten layer 203A has a thickness less than approximately 1,000 Å; especially, a preferable thickness of the tungsten layer 203A ranges from approximately 100 Å to approximately 1,000 Å in consideration of etch selectivity with respect to a subsequent photoresist pattern.

Herein, the substrate 200 includes an insulation structure and a conductive structure. If the conductive layer 201A is used for forming a bit line or a metal line, a diffusion barrier layer made of Ti and TiN is formed between the conductive layer 201A and the substrate 200 and impurity junction regions such as sources/drains, an inter-layer insulation layer and a plug made of polysilicon or tungsten are formed. Meanwhile, if the conductive layer is for forming a gate structure, a gate insulation layer is also formed at an interface between the conductive layer 201A and the substrate 200.

Subsequently, an anti-reflective coating (ARC) layer 204A is formed on the tungsten layer 203A for the purpose of preventing formation of undesired patterns because of scattering reflection caused by a high index of reflection of the tungsten layer 203A during a photo-exposure process for forming patterns on the tungsten layer 203A. Also, the ARC layer 204A plays another role in improving adhesion between the tungsten layer 203A and the subsequent photoresist pattern. Herein, the ARC layer 204A is formed by using an organic material having similar etch characteristics to photoresist and an inorganic material like SiON.

Afterwards, a photoresist layer for use in a light source of $F_2$ or ArF is formed on the ARC layer 204A by employing a spin coating method until an intended thickness of the photoresist layer is obtained. At this time, the photoresist layer is made of cycloolefin-maleic anhydride (COMA) or acrylate. Thereafter, a portion of the photoresist layer is selectively photo-exposed through the use of a photo-exposure device for $F_2$ or ArF and a predetermined reticle (not shown) for defining a width of a bit line structure. A developing process is then performed to make a photo-exposed portion or non-photo-exposed portion of the photoresist layer remain. Subsequent to the developing process, a cleaning process is performed to remove etch remnants, thereby completing formation of a photoresist pattern 205A.

Figure 3B:
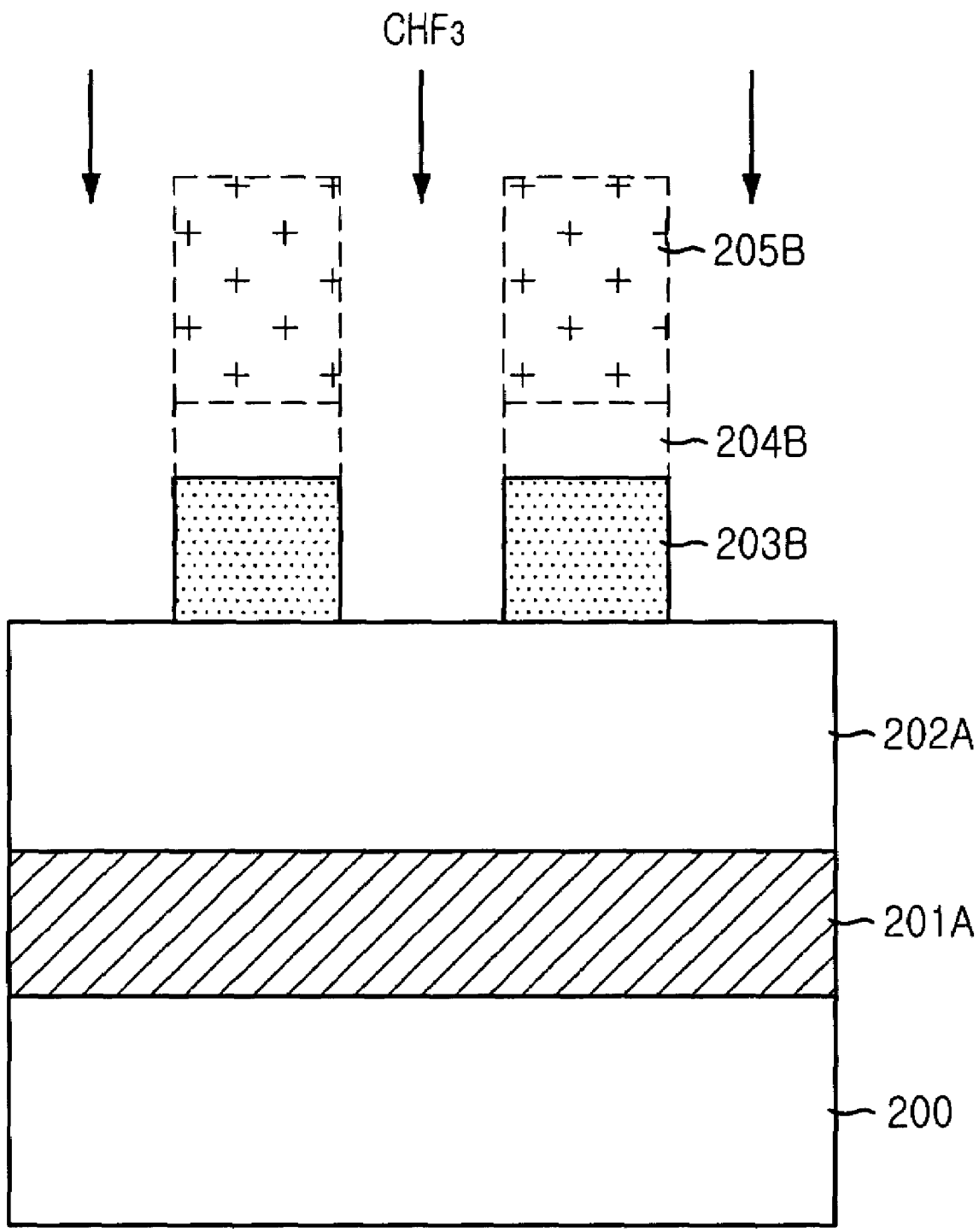

Referring to FIG. 3B, the ARC layer 204A shown in FIG. 3A is selectively etched by using the photoresist pattern 205A as an etch mask, thereby forming a patterned ARC layer 204B. At this time, the above etching process proceeds by using preferably a plasma containing a chorine-based gas such as $Cl_2$, $BCl_3$, $CCl_4$ or HCl to minimize losses of the photoresist pattern 205A. In case that a carbon fluoride (CF)-based gas is used, the etching process proceeds by using preferably a plasma with a gas having a low ratio of Carbon to fluorine. Such gas is selected from a group consisting of $CF_4$, $C_2F_2$, $CHF_3$ and $CH_2F_2$. The above mentioned gas is selected to minimize generation of polymers during the etching process since it is necessary to control a CD during the etching of the ARC layer 204A shown in FIG. 3A. Also, it should be noted that a reference denotation 205B denotes a remaining photoresist pattern after the above etching process.

Afterwards, the tungsten layer 203A shown in FIG. 3A is etched by using the remaining photoresist pattern 205B as an etch mask to form a plurality of sacrificial hard masks 203B. In more detail of the etching of the tungsten layer 203A, such a gas as $SF_6$, $CF_4$ or $NF_3$ is used since the tungsten layer 203A is formed by employing a tungsten-based material selected from tungsten (W), tungsten silicide ($WSi_x$) and tungsten nitride (WN).

According to the conventional method, nitrogen ($N_2$) gas is additionally added to the above selected gas for etching a tungsten layer, and in addition to a chemical etching based on a chemical reaction by a fluorine-based gas such as $SF_6$, $CF_4$ or $NF_3$, this addition of the nitrogen gas induces a physical etching that destructs binding of the tungsten layer 203A. Because of this physical etching due to the addition of the $N_2$ gas, it is difficult to secure a desired level of etch selectivity between the tungsten layer and the photoresist layer applicable to the design rule of 80 nm or 70 nm semiconductor technology.

To overcome this disadvantage, instead of using nitrogen gas, it is suggested in the first embodiment of the present invention to use a gas of $CHF_3$ which induces a chemical etching of the tungsten layer 203A with generating a small amount of polymer. At this time, chamber pressure, temperature and applied power are variable depending on thicknesses of the tungsten layer 203A and the remaining photoresist pattern 205B.

Figure 3C:
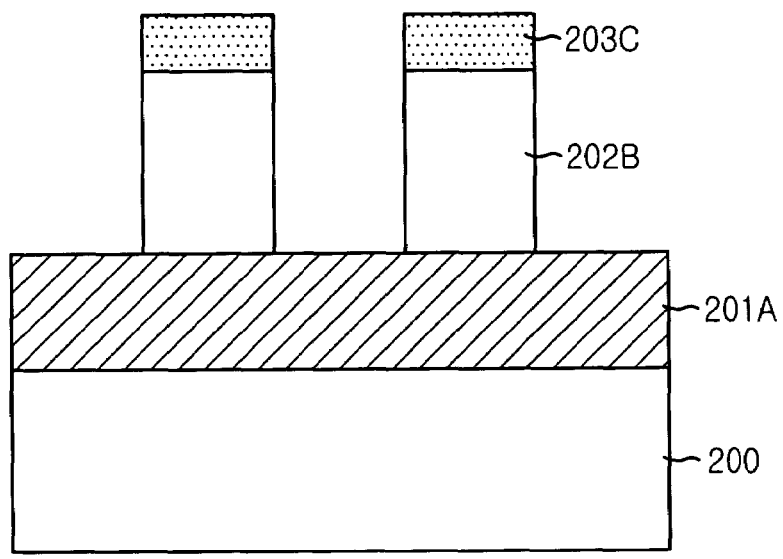

Referring to FIG. 3C, with using at least the sacrificial hard masks 203B as an etch mask, the insulation layer 202A shown in FIG. 3B is etched to form a plurality of hard masks 202B for use in bit lines. At this time, the remaining photoresist pattern 205B and the patterned ARC layer 204B are almost removed or remain partially and thus, the remaining photoresist pattern 205B and the patterned ARC layer 204B can still act as an etch mask if not being removed by employing a separate photoresist stripping process. Also, it should be noted that a reference numeral 203C denotes a remaining sacrificial hard mask after this etching process.

At the time of etching the insulation layer 202A shown in FIG. 3B, a commonly employed main etch gas for etching nitride or oxide, i.e., a CF-based gas is employed. Also, since it is possible to maintain a sufficient thickness of the remaining sacrificial hard mask as denoted with 203C, there is not an incidence of pattern deformation during the etching process for forming the hard masks 202B.

Figure 3D:
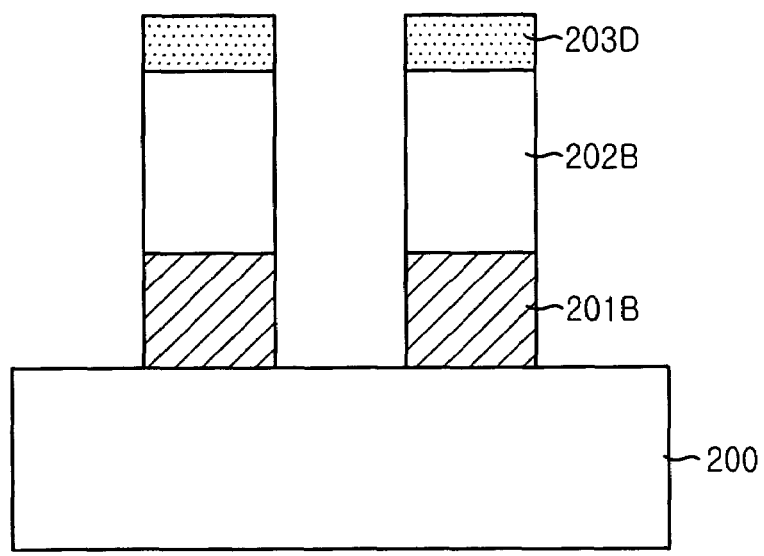

Referring to FIG. 3D, the conductive layer 201A shown in FIG. 3C is selectively etched by employing the remaining sacrificial hard masks 203C as an etch mask to form conductive patterns 201B, more particularly, bit lines. When the conductive layer 201A is etched, an etch gas type, a quantity of the selected etch gas and applied power are adjusted depending on a type of a material used for forming the conductive layer 201A. Herein, it should be noted that a reference denotation 203D denotes a residual sacrificial hard mask still remaining after the above etching process.

Figure 3E:
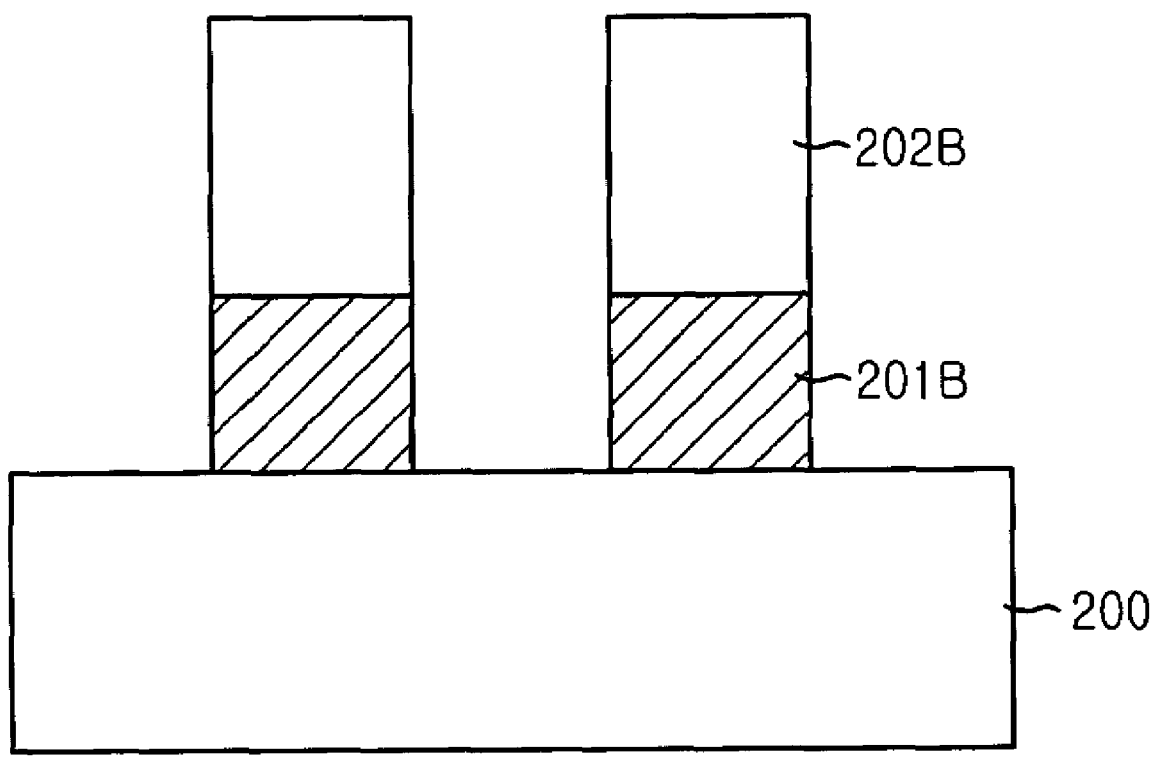

Referring to FIG. 3E, the residual sacrificial hard masks 203D are removed. If the residual sacrificial hard masks 203D and the conductive layer 201A are made of the same material of tungsten, the residual sacrificial hard masks 203D can be removed as simultaneous to the formation of the conductive patterns 201B. It is also possible to remove the residual sacrificial hard masks 203D separately, and in this case, a fluorine-based gas such as $SF_6$, $CF_4$ or $NF_3$ is used.

It is noted that after the etching process for forming the sacrificial hard masks 203B, the photoresist patterns 205B are barely deformed. Also, even in case that a slight over-etching process is applied to the pattern structures obtained after the above etching process for forming the sacrificial hard masks 203B, the photoresist patterns 205B are barely deformed as well. Furthermore, the hard masks 202B and conductive patterns, i.e., the bit lines 201B, are formed without being damaged.

Figure 4:
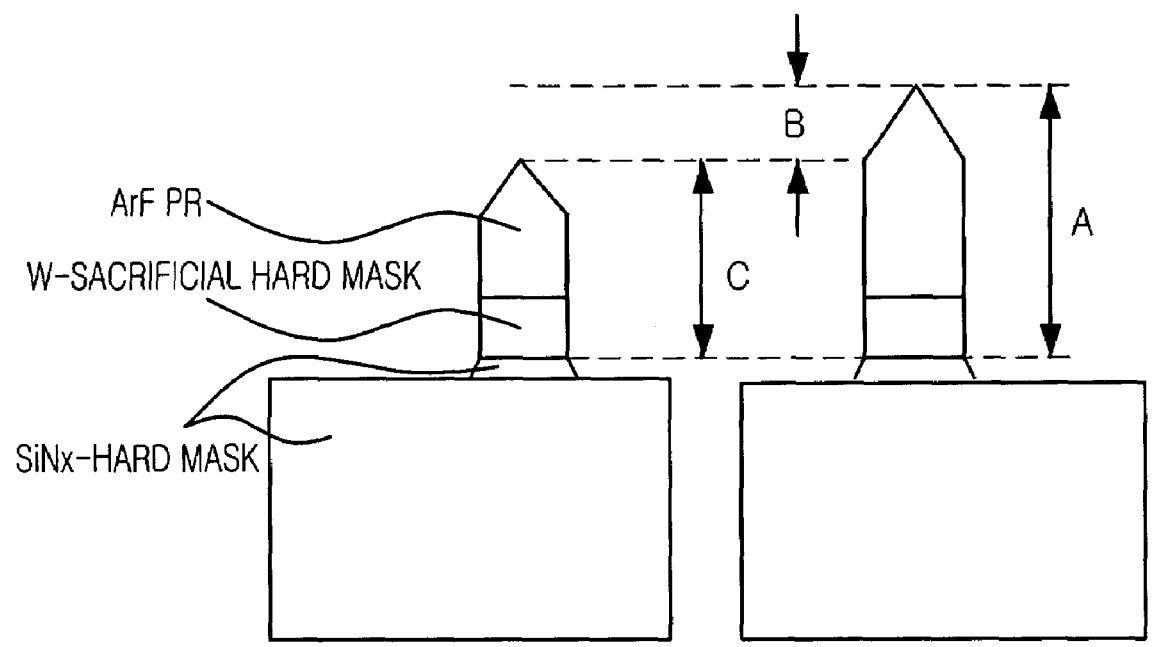
FIG. 4 is a diagram depicting a difference between a typically constructed pattern structure and a pattern structure constructed based on the first embodiment of the present invention after a sacrificial hard mask is formed.

FIG. 4 is a diagram showing a difference in thickness between a conventional photoresist pattern and a photoresist pattern in accordance with the first embodiment of the present invention after a sacrificial hard mask is formed. Herein, the photoresist pattern is for use in ArF photolithography.

The photoresist pattern in the left side is obtained when the conventional method is applied with use of the aforementioned $N_2$ gas, while that in the right side is obtained when the first embodiment employing a gas of $CHF_3$ is applied. Reference denotations, 'A' and 'C', represent a thickness of the conventional photoresist pattern and that obtained based on the first embodiment, respectively. Thus, the thickness of the photoresist pattern in accordance with the present invention is thicker than that of the conventionally obtained photoresist pattern by a value denoted with a reference denotation, 'B'.

FIGS. 5A to 5E are cross-sectional views showing a method for forming conductive patterns in a semiconductor device with use of $F_2$ or ArF photolithography in accordance with a second embodiment of the present invention.

Hereinafter, the method for forming the conductive patterns in accordance with second embodiment is similar to that described in the first embodiment and thus, detailed description of the second embodiment involving the same steps of forming the conductive patterns as described in the first embodiment will be omitted.

However, there exist several differences between the second embodiment and the first embodiment. First difference lies in the thickness. In more detail, an insulation layer 302A shown in FIG. 5A, for instance, is formed in a stack structure of nitrides or a stack structure of nitride and oxide, and an overall thickness of this stack structure preferably ranges from approximately 1,500 Å to approximately 3,000 Å. Also, the thickness of a tungsten layer 303A for use in a sacrificial hard mask is different by ranging from approximately 300 Å to approximately 500 Å in consideration of etch selectivity with respect to a subsequent photoresist pattern.

Another difference is that when the tungsten layer 303A is etched by using $CHF_3$ as a main etch gas for forming sacrificial hard masks 303B, a bias power less than approximately 100 W is applied to reduce a frequency of line edge roughness (LER) effect even though chamber pressure, temperature and power varies depending on thicknesses of the tungsten layer 303A and a remaining photoresist pattern 305B showing in FIG. 5B.

Figure 5A:
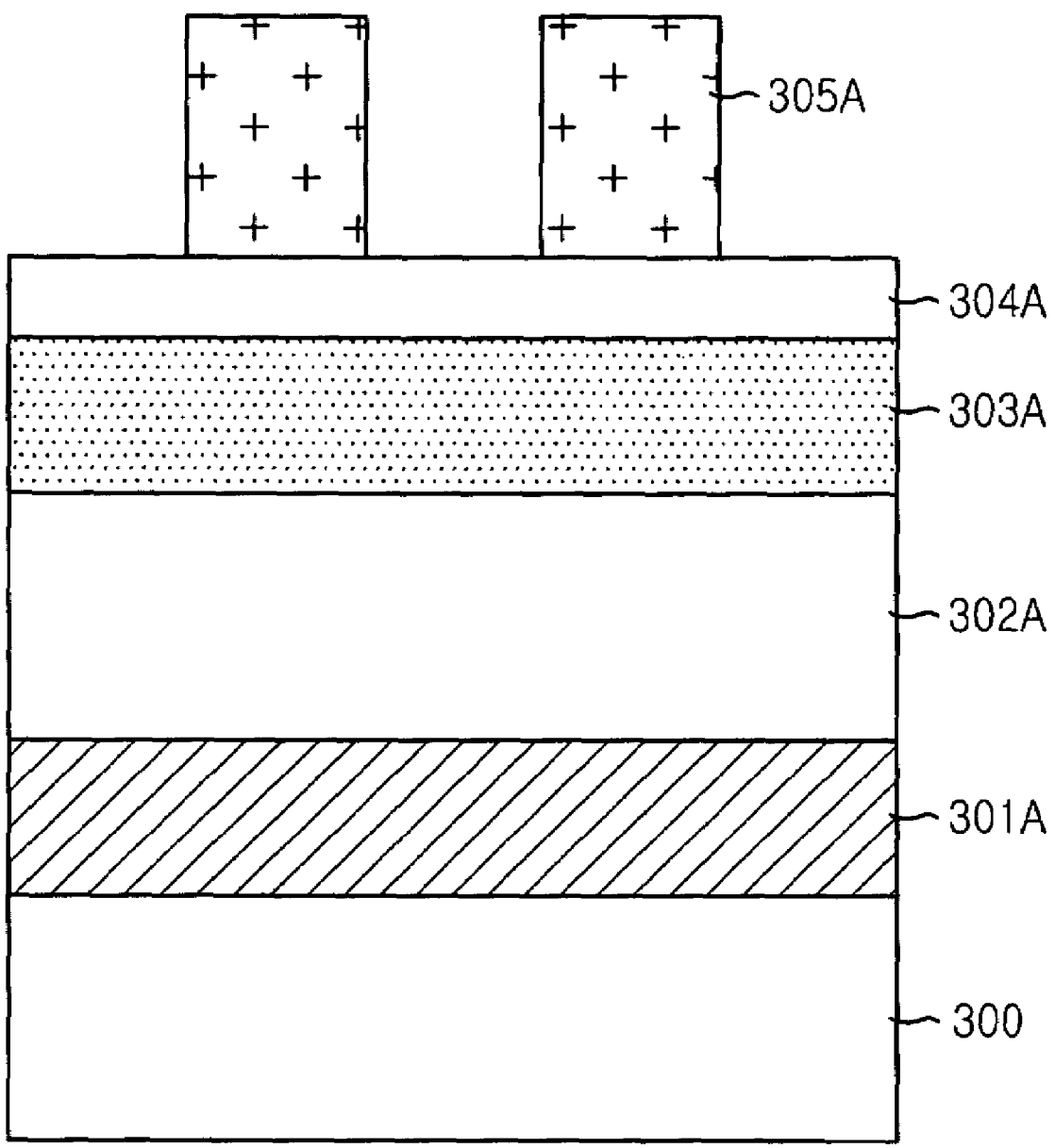
Figure 5C:
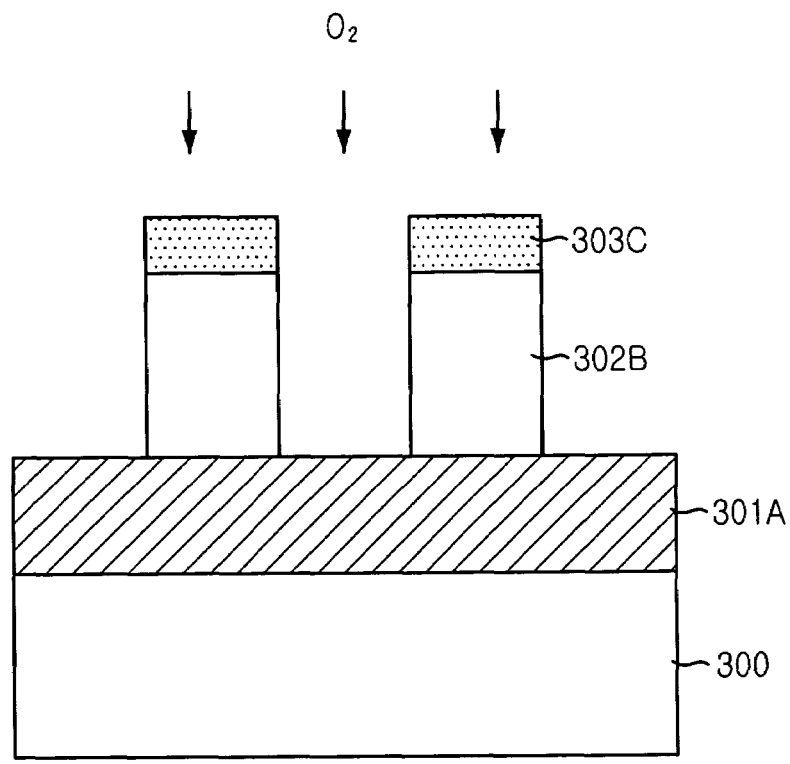
Figure 5D:
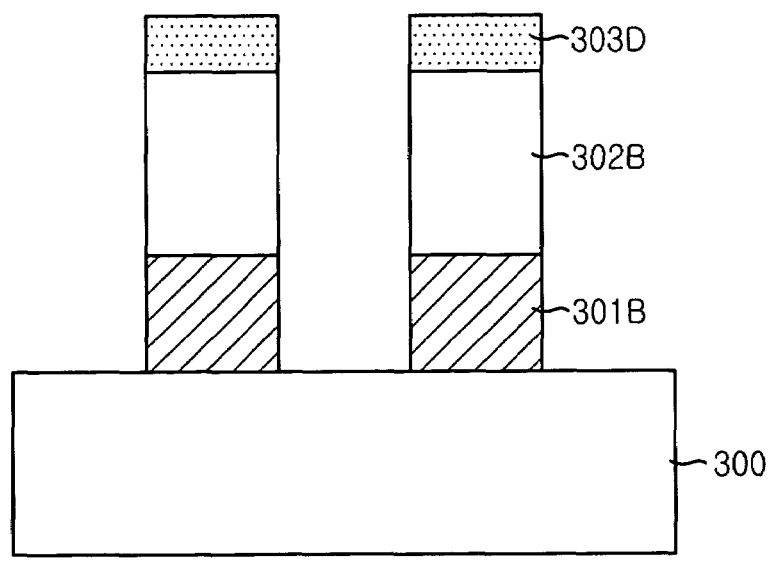
Figure 5E:
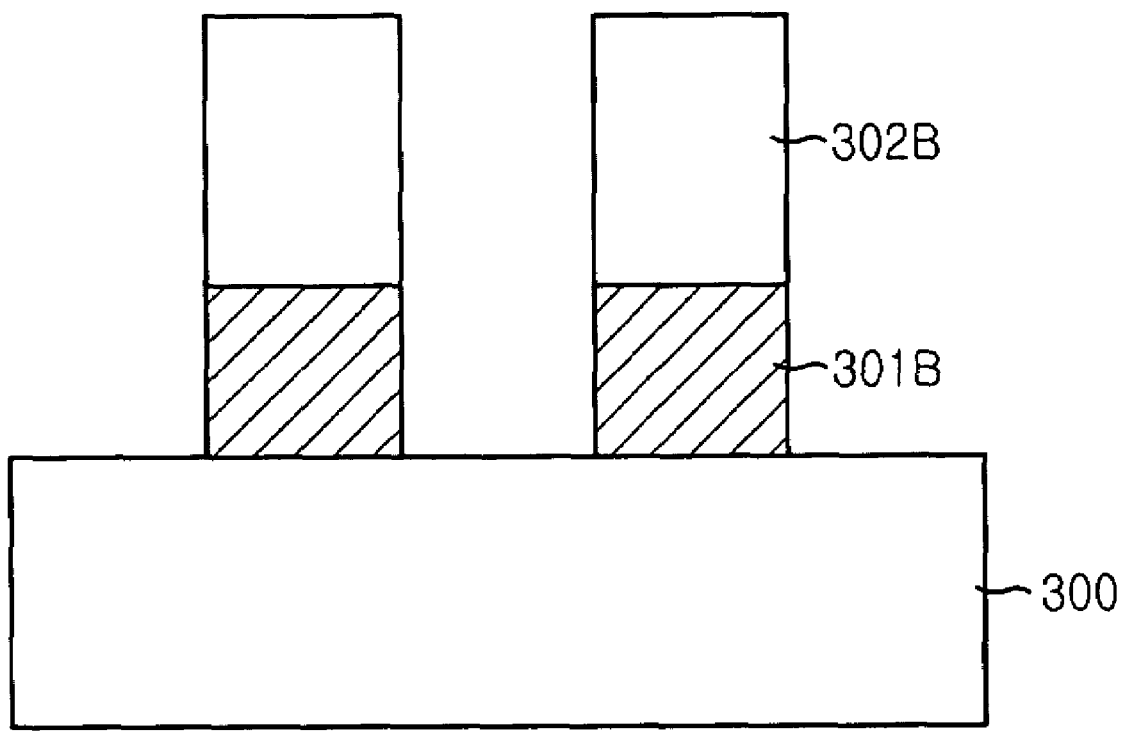

Furthermore, unlike the first embodiment, at the step of forming hard masks 302B, a different etch gas is used. With reference to FIG. 5C, the step of forming the hard masks 302B will be described more specifically.

As shown in FIG. 5C, at the time of etching the insulation layer 302A for forming the hard masks 302B by using the sacrificial hard masks 303B as an etch mask, instead of employing a commonly employed main etch gas for etching a nitride or oxide, i.e., a CF-based gas, the second embodiment uses a plasma containing oxygen gas in order to decrease a peripheral ID bias during the etching of the insulation layer 302A of which thickness is greater than approximately 2,000 Å. A reference numeral 303C denotes a remaining sacrificial hard mask after this etching process. Also, it should be noted that even when the plasma containing the oxygen gas is used, there is not an incidence of pattern deformation during the etching process for forming the hard masks 302B because a sufficient thickness of the sacrificial hard mask as denoted with 303C can be maintained.

Figure 6:
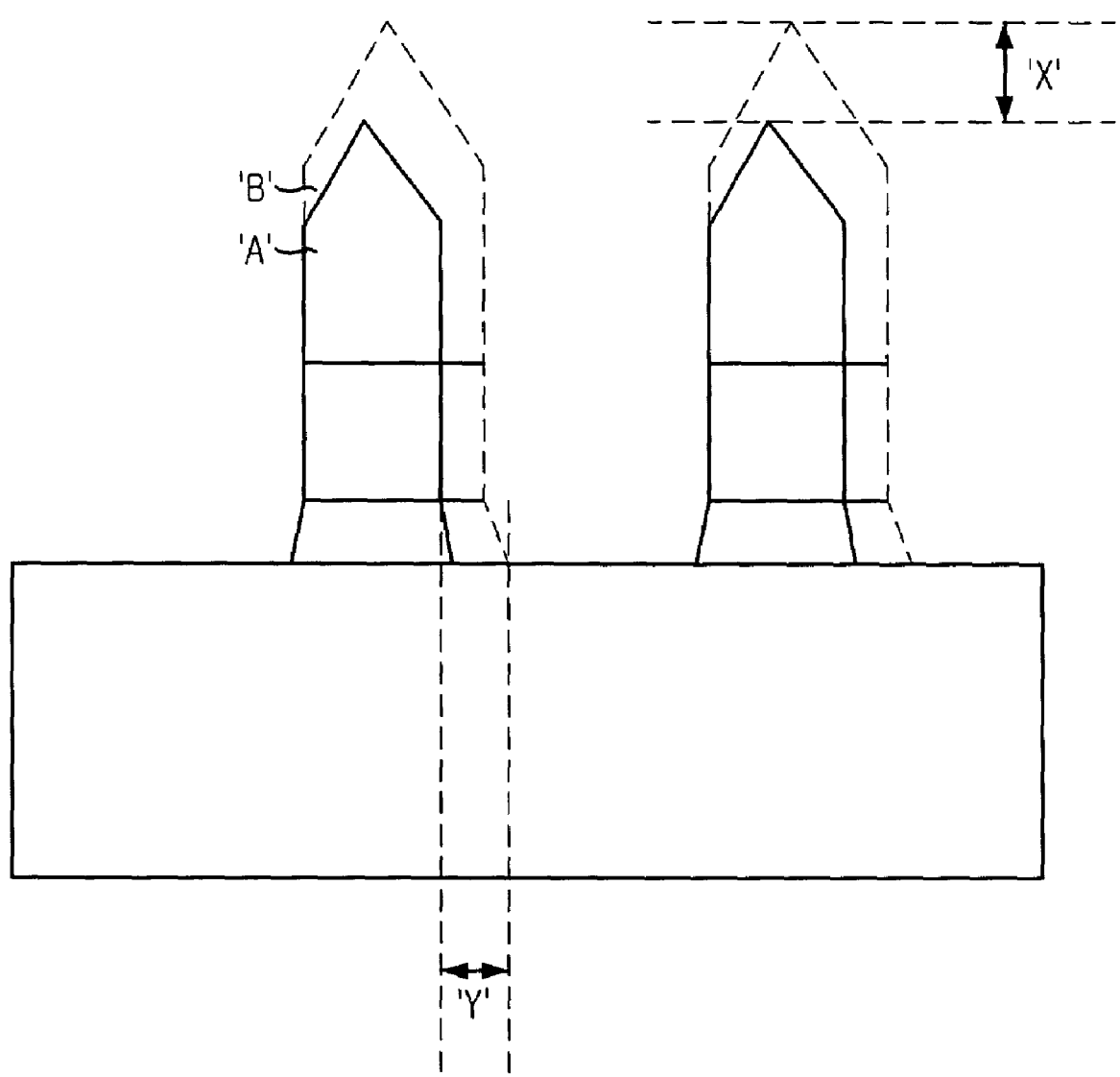
FIG. 6 is an overlapped diagram showing a difference between a conventional photoresist pattern and a photoresist pattern formed in accordance with the second embodiment of the present invention after a sacrificial hard mask is formed.

FIG. 6 is an overlapped diagram showing a difference between a conventional photoresist pattern and a photoresist pattern in accordance with the second embodiment after a sacrificial hard mask is formed.

A reference denotation 'A' represents the conventional photoresist pattern obtained by employing nitrogen gas additionally. On the other hand, a reference denotation 'B' represents the photoresist pattern obtained when CHF$_3$ gas is used as described in the preferred embodiment. The photoresist pattern 'B' remaining after the formation of the sacrificial hard mask is greater than that of the photoresist pattern 'A'. A reference denotation 'X' expresses this thickness difference. Also, a reference denotation 'Y' expresses a difference between a CD defined by the preferred embodiment of the present invention and a CD defined by the conventional method.

Figure 7:
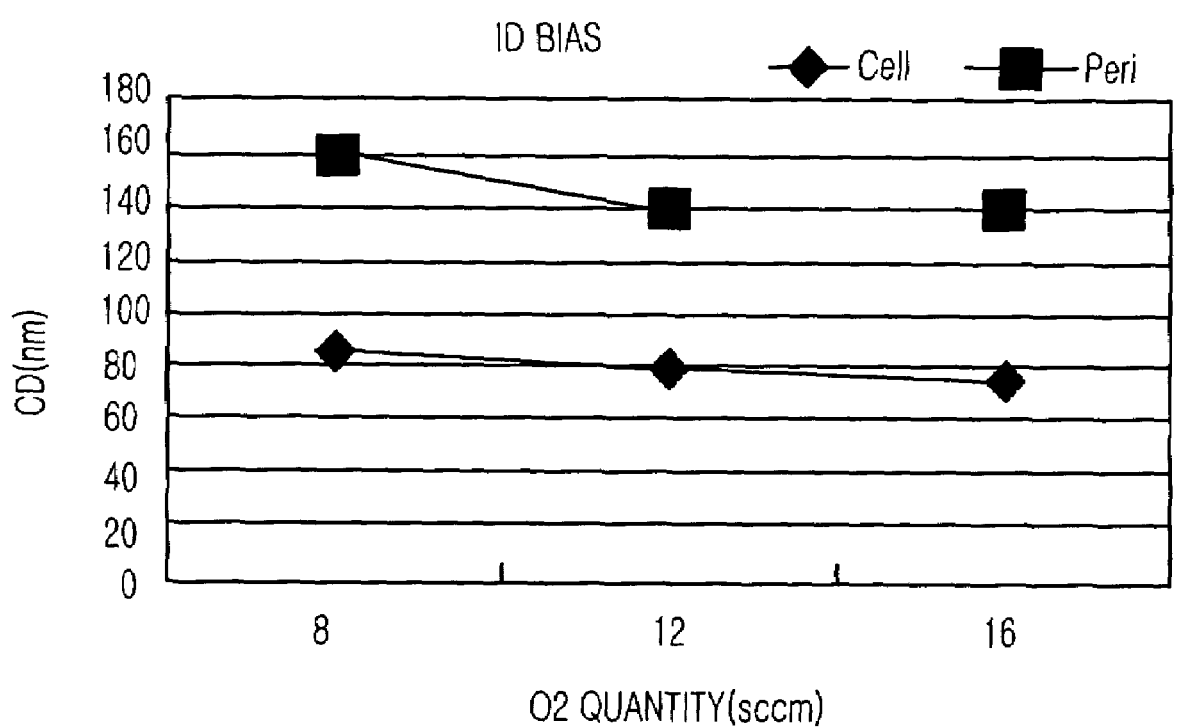
FIG. 7 is a graph showing a change in a critical dimension (CD) of a cell region and of a peripheral region during an etching process for forming a hard mask in accordance with the second embodiment of the present invention.

FIG. 7 is a graph showing a change in a CD of a cell region and of a peripheral region with respect to a quantity of an etch gas during an etching of a hard mask in accordance with the second embodiment of the present invention.

Especially, the change in the CD of the cell region and of the peripheral region measured in the unit of nanometers (nm) is examined in relation with a quantity of oxygen gas provided in the unit of SCCM. For instance, when the quantity of the provided oxygen gas is approximately 8 sccm, the CD of the cell region and that of the peripheral region are approximately 86.2 nm and approximately 159.8 nm, respectively. When the quantity of the oxygen gas increases to approximately 12 sccm, the CD of the cell region is approximately 80.1 nm, while the CD of the peripheral region is approximately 139.8 nm. Therefore, it can be concluded that when the provided quantity of the oxygen gas increases by approximately 4 sccm, the CD of the cell region decreases by approximately 6.1 nm, while that of the peripheral region decreases by approximately 20 nm. Hence, the CD of the peripheral region can be reduced by approximately 3.3-fold.

Meanwhile, if the sacrificial hard mask is made of polysilicon instead of tungsten as described in the above embodiments, a gas of HBr is used as a main etch gas. Also, a quantity ratio of HBr gas to O$_2$ gas is set to be approximately 100 to approximately 1 in order to control the ID bias.

Figure 8A:
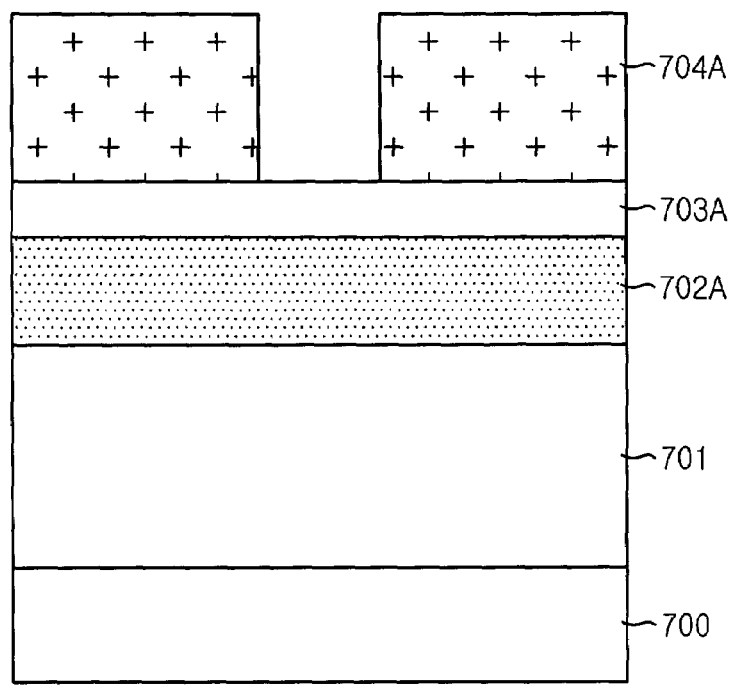
FIGS. 8A to 8C are cross-sectional views illustrating a method for forming a pattern in a semiconductor device by using one of ArF photolithography and F2 photolithography in accordance with a third embodiment of the present invention.
Figure 8B:
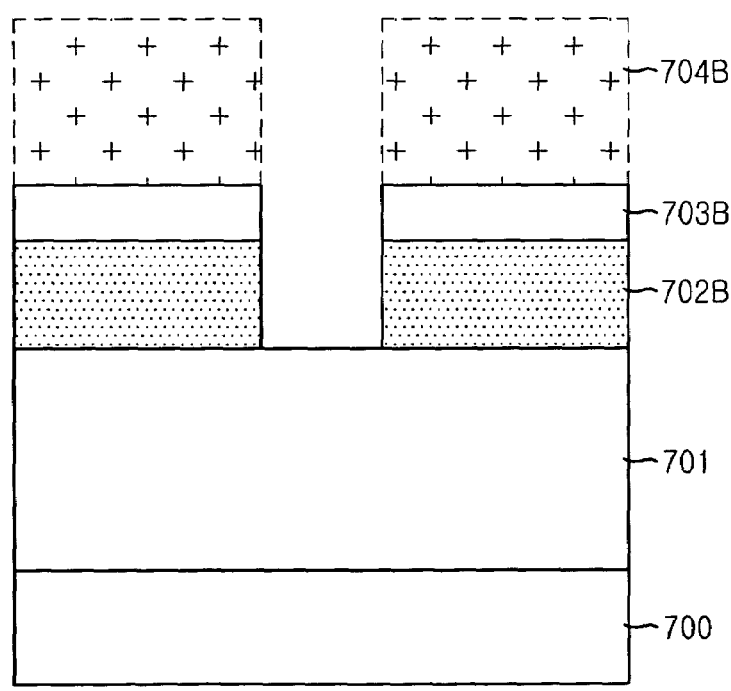
Figure 8C:
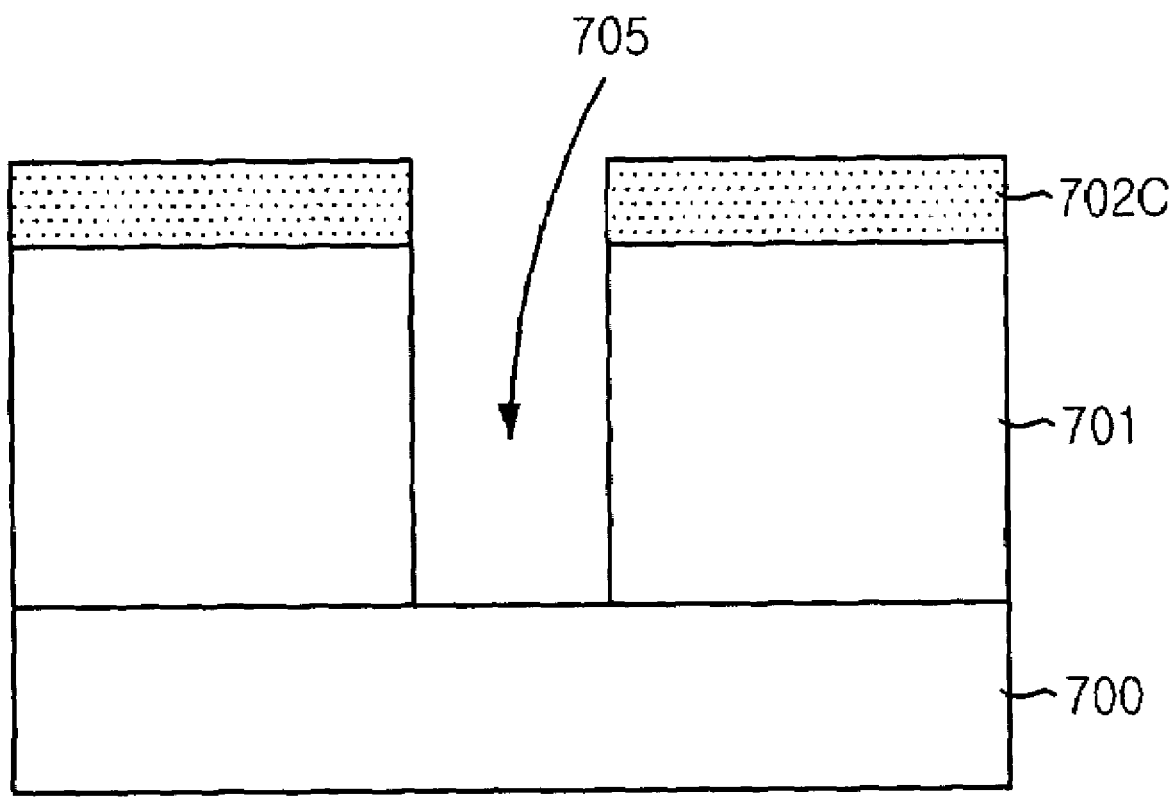

FIGS. 8A to 8C are cross-sectional views illustrating a method for forming patterns in a semiconductor device with use of F$_2$ or ArF photolithography in accordance with a third embodiment of the present invention.

The third embodiment of the present invention exemplifies a case of forming a contact hole pattern. More specifically, this contact hole pattern can be applicable to a metal line contact, a contact between one of a bit line and a storage node of a capacitor and an impurity junction such as a source/drain and a contact pad. Also, the contact hole pattern can be applicable to a process for forming a trench for device isolation in which an etch target is an insulation layer and a process for etching an etch target based on a conductive material, e.g., a polysilicon layer, to open a channel region of a thin film transistor. That is, these pattern formation processes are negative type of patterns.

Referring to FIG. 8A, an insulation layer 701, which is an etch target layer, is formed on a substrate 700 provided with various device elements. The insulation layer 701 is based on a material such as impurity doped or undoped oxide or impurity doped or undoped nitride. Then, a tungsten layer 702A for use in a sacrificial hard mask is formed on the insulation layer 701 to prevent pattern deformation caused by damages to the insulation layer 701 during an etching process.

Next, an anti-reflective coating (ARC) layer 703A is formed on the tungsten layer 702A to prevent formation of undesired patterns caused by scattering reflection due to a high index of reflection of the tungsten layer 702A during a photo-exposure process for forming patterns and to improve adhesion between the tungsten layer 702A and a subsequent photoresist pattern. Herein, the ARC layer 703A can be made of an organic material of which etch characteristic is similar to an employed photoresist layer or an inorganic material such as SiON.

Afterwards, a photoresist layer for use in F$_2$ or ArF photolithography is formed on the ARC layer 703A by employing a spin coating method. At this time, the photoresist layer is based on a material such as COMA or acrylate. The photoresist layer is subjected to a selective photo-exposure process with use of a predetermined reticle (not shown) for defining a width of an intended contact and a device using a light source of F$_2$ or ArF. Then, a developing process is performed to make photo-exposed or non-photo-exposed portions of the photoresist layer remain and then, etch remnants are removed by employing a cleaning process, thereby forming a photoresist pattern 704A.

Referring to FIG. 8B, the ARC layer 703A shown in FIG. 8A is selectively etched by using the photoresist pattern 704A shown in FIG. 8A as an etch mask, thereby obtaining a patterned ARC layer 703B. At this time, in order to minimize losses of the photoresist pattern 704A, the above etching process proceeds by using a plasma containing a chlorine-based as Cl$_2$, BCl$_3$, CCl$_4$, HCl or the like. If a CF-based gas is used, the above etching process is carried out by employing a plasma containing a gas of which ratio of carbon to fluorine is low. Such gas is selected from a group consisting of CF$_4$, C$_2$F$_2$, CHF$_3$ and CH$_2$F$_2$. The reason for selecting this specific type of the etch gas is to carry out the etching process without producing polymers because CD control should be easy during the etching process for forming the patterned ARC layer 703B. Also, a reference numeral 703B denotes a photoresist pattern remaining after the above etching process.

Next, the tungsten layer 702A is etched by using the remaining photoresist pattern 704B as an etch mask to form a plurality of sacrificial hard masks 702B.

Hereinafter, this etching process for forming the sacrificial hard masks 702B will be described in detail. Such a gas as SF$_6$, CF$_4$ or NF$_3$ is used since the tungsten layer 702A is formed by employing a tungsten-based material selected from tungsten (W), tungsten silicide (WSi$_x$) and tungsten nitride (WN).

According to the conventional method, nitrogen (N$_2$) gas is additionally added to the above selected gas for etching a tungsten layer, and in addition to a chemical etching based on a chemical reaction by a fluorine-based gas such as SF$_6$, CF$_4$ or NF$_3$, this addition of the nitrogen gas induces a physical etching that destructs binding of the tungsten layer 702A. Because of this physical etching due to the addition of the N$_2$ gas, it is difficult to secure a desired level of etch selectivity between the tungsten layer and the photoresist layer applicable to the design rule of 80 nm or 70 nm semiconductor technology.

To overcome this disadvantage, instead of using nitrogen gas, it is suggested in the third embodiment of the present invention to use a gas of CHF$_3$ which induces a chemical etching of the tungsten layer 702A with generating a small amount of polymers. At this time, chamber pressure, temperature and applied power are variable depending on thicknesses of the tungsten layer 702A and the remaining photoresist pattern 704B.

Referring to FIG. 8C, with using at least the sacrificial hard masks 702B as an etch mask, the insulation layer 701A shown in FIG. 8B is selectively etched to form a contact hole 75 exposing a surface of the substrate 700, more particularly, a surface or top portion of a conductive structure. At this time, the remaining photoresist pattern 704B and the patterned ARC layer 703B are almost removed or remain partially and thus, the remaining photoresist pattern 704B and the patterned ARC layer 703B can still act as an etch mask if not being removed by employing a separate photoresist stripping process. Also, it should be noted that a reference numeral 702C denotes a remaining sacrificial hard mask after this etching process.

Subsequently, the remaining sacrificial hard masks 702C are removed. It is also possible to remove the remaining sacrificial hard masks 702C at the time of etching the insulation layer 701 through controlling a thickness of the remaining sacrificial hard mask 702C. It is still possible to remove the remaining sacrificial hard masks 702C through performing an additional process and in this case, such a fluorine containing gas as $SF_6$, $CF_4$ or $NF_3$ is used.

Hereinafter, an etch recipe for etching an oxide layer which is a basis material for the insulation layer 701 will be described in detail.

The insulation layer 701 is etched by using a typically employed CF-based etch gas such as $CF_4$, $CHF_3$, $CH_2F_2$, $C_4F_6$, $C_4F_8$, $C_3F_8$ or $C_5F_8$ at a magnetic enhancement reactive ion etching (MERI) apparatus. At this time, the CF-based etch gas flows in a quantity ranging from approximately 20 sccm to approximately 100 sccm while a range of power from approximately 1,000 W to approximately 2,500 W is applied. At this time, a pressure within the MERI apparatus is maintained in a range from approximately 25 mTorr to approximately 70 mTorr. Also, a temperature of a cathode is maintained in a range from approximately −20° C. to approximately +60° C. In addition to the above mentioned main etch gas, for the purpose of controlling etch profiles, oxygen gas can be additionally added in a flow quantity that is approximately 65% to approximately 80% of the employed CF-based main etch gas.

Hereinafter, detailed description of a pattern for forming contacts applied to a dynamic random access memory (DRAM) device will be provided.

Figure 9:
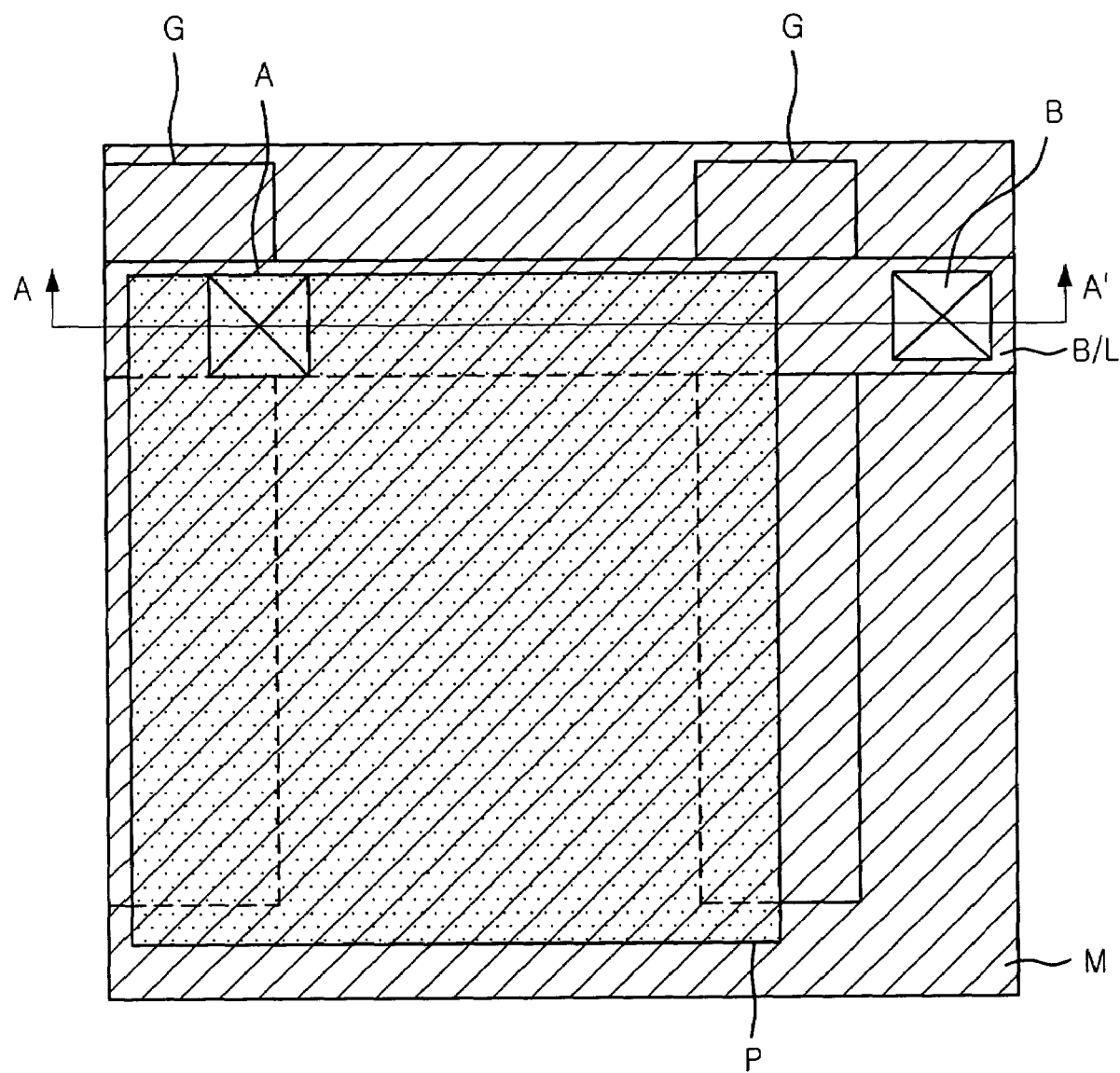
FIG. 9 is a top view of a semiconductor device including a mask pattern for forming metal lines in accordance with a fourth embodiment of the present invention.

FIG. 9 is a top view showing a semiconductor device with a mask pattern for forming a metal line in accordance with a fourth embodiment of the present invention.

As shown, there are a number of gate electrodes G and on top of the selected gate electrode G, a bit line B/L is formed in a cross-direction to the selected gate electrode G. Although not illustrated, there are a cell contact plug formed between the gate electrodes G, a storage node contact plug connected to the cell contact plug, a storage node connected to the storage node contact plug, and a dielectric layer formed on the storage node. On the dielectric layer, a plate electrode P is formed, being overlaid with a mask pattern M for forming a metal line contact. Herein, the gate electrodes G, the bit line B/L and the plate electrode P should be connected with the metal line to make a connection with signals and power lines. The mask pattern M is used for forming a contact A for a metal line connected with the plate electrode P and another contact B for a metal line connected with the bit line B/L.

Figure 10:
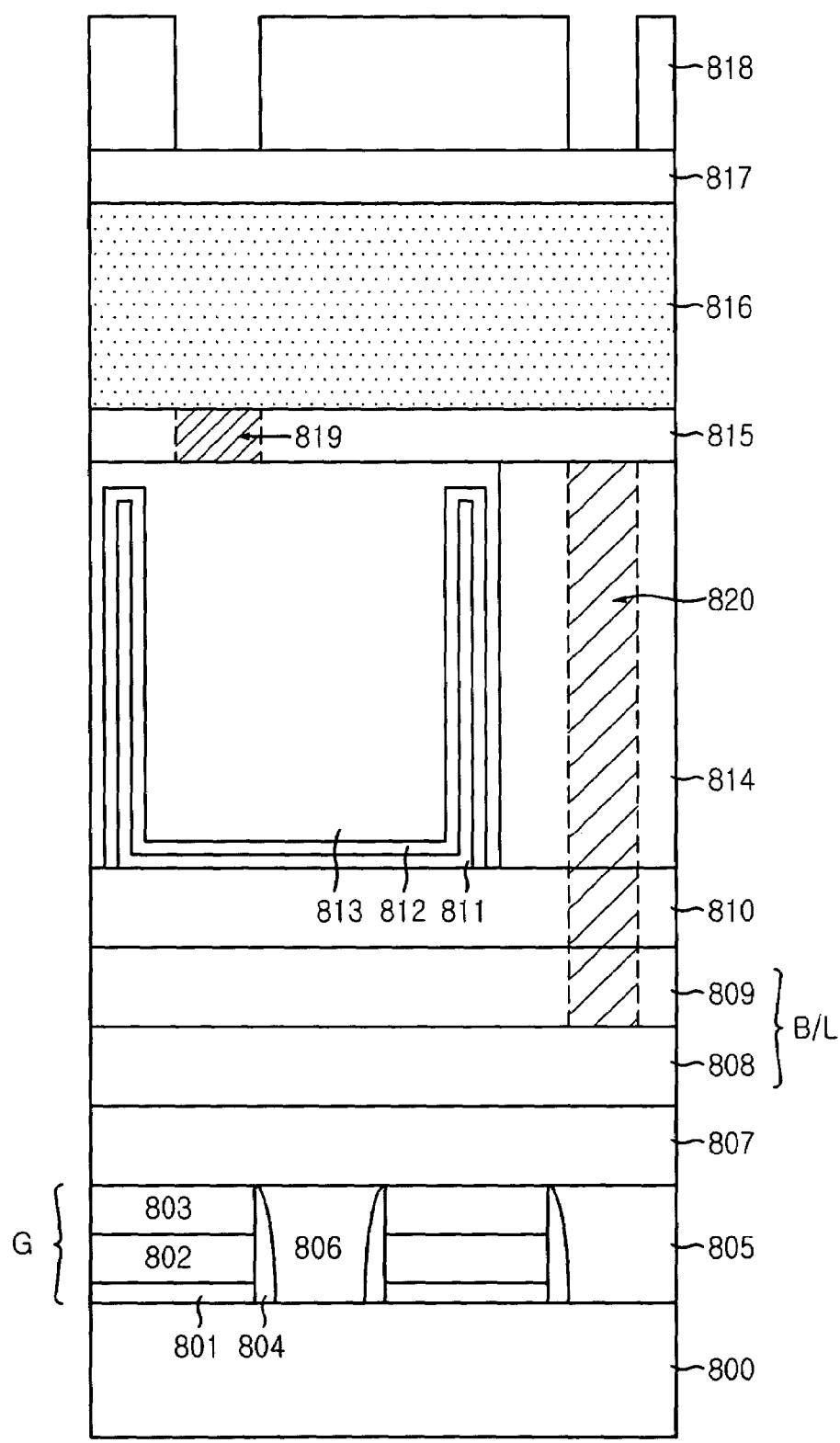
FIG. 10 is a cross-sectional view showing the semiconductor device taken along a line A-A' shown in FIG. 9.

FIG. 10 is a cross-sectional view showing the semiconductor device taken along a line A-A' shown in FIG. 9.

As shown, a plurality of the gate electrodes G each including a gate oxide layer 801, a gate conductive layer 802 and a gate hard mask 803 are formed on a substrate 800. On sidewalls of the individual gate electrodes G, spacers 804 are formed. Also, the gate electrodes G are encompassed by a first inter-layer insulation layer 805, and a cell contact plug 806 makes a contact with an impurity diffusion region of the substrate 800 by passing through the first inter-layer insulation layer 805 and, is planarized at the same level of the gate hard mask 803.

On the cell contact plug 806, a second inter-layer insulation layer 807 is formed. The bit line B/L is formed on the second inter-layer insulation layer 807. Although it is not illustrated in this drawing, the bit line B/L is electrically connected with the cell contact plug 806 by passing through the second inter-layer insulation layer 807. The bit line B/L includes a bit line conductive layer 808 and a bit line hard mask 809, and although not illustrated, spacers are formed on sidewalls of the bit line B/L.

A third inter-layer insulation layer 810 is formed on the bit line B/L. Although not illustrated, a storage node contact plug that is electrically connected with the cell contact plug 806 by passing through the third inter-layer insulation layer 810 and the second inter-layer insulation layer 807 is formed on the third inter-layer insulation layer 810.

A storage node 811, a dielectric layer 812 and a plate electrode 813 denoted with 'P' in FIG. 9 are sequentially formed on the storage node contact plug, thereby forming a capacitor in a cell region. Also, a fourth inter-layer insulation layer 814 is formed in a region where the cell capacitor is not formed.

Next, a fifth inter-layer insulation layer 815 is formed on the cell capacitor and the fourth inter-layer insulation layer 814. Subsequently, a tungsten layer 816 for use in a sacrificial hard mask, an ARC layer 817 and a photoresist pattern 818 are sequentially formed on the fifth inter-layer insulation layer 815.

A first etch target for forming the metal line connected with the plate electrode 813 is denoted with a reference numeral 819, and it is not difficult to apply the etching process to the first etch target since the etch target is encompassed by the fifth inter-layer insulation layer 815.

On the other hand, a second etch target for forming another metal line connected with the bit line B/L is denoted with a reference numeral 820. However, as shown in the drawing, the second etch target 820 is thick by including the fifth inter-layer insulation layer 815, the fourth inter-layer insulation layer 814, the third inter-layer insulation layer 810 and the bit line hard mask 809. Especially, the thickness of the fourth inter-layer insulation layer 814 is identical to the height of the cell capacitor. For instance, the thickness of the fourth inter-layer insulation layer 814 is approximately 20,000 Å. Thus, the thickness of the second etch target 820 is greater than this mentioned thickness; that is, the thickness of the second etch target 820 is approximately 30,000 Å. Therefore, it is impossible to form a contact hole pattern without using a tungsten-based sacrificial hard mask in sub-80 nm semiconductor technology.

In case that the tungsten layer 816 for use in a sacrificial hard mask with a thickness less than approximately 1,000 Å is employed, an etch gas of $CHF_3$ is used instead of $N_2$ gas. As a result of this etch gas, the etching process can be carried out with a sole use of the photoresist pattern 818.

Figure 11:
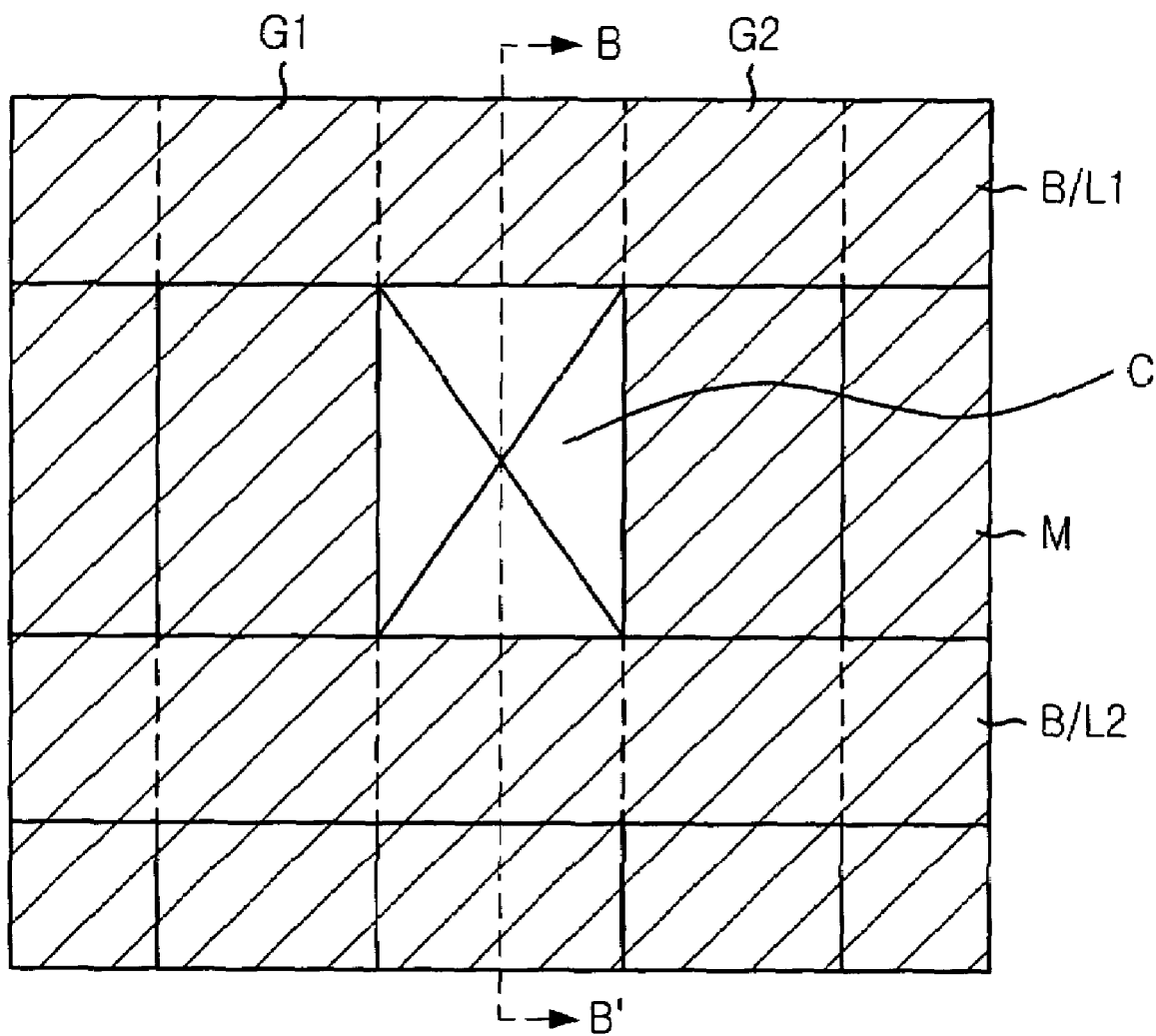
FIG. 11 is a top view showing a semiconductor device including a mask pattern for forming a storage node contact in accordance with a fifth embodiment of the present invention.

FIG. 11 is a top view showing a semiconductor device with a mask pattern for forming a storage node contact in accordance with a fifth embodiment of the present invention.

As shown, there are a plurality of gate electrodes G1 and G2 arranged with a predetermine distance. A plurality of bit lines B/L1 and B/L2 are formed above the plurality of gate electrodes G1 and G2 in a cross-direction to the gate electrodes G1 and G2. Although not illustrated, there is a cell contact plug formed between the gate electrodes G1 and G2. Also, a mask pattern M for forming a storage node contact hole is formed above the bit lines B/L1 and B/L2. Herein, the mask pattern M is aligned to one lateral side of each of the bit lines B/L1 and B/L2 and serves a role in exposing the cell contact plug at a region denoted with 'C'.

Figure 12:
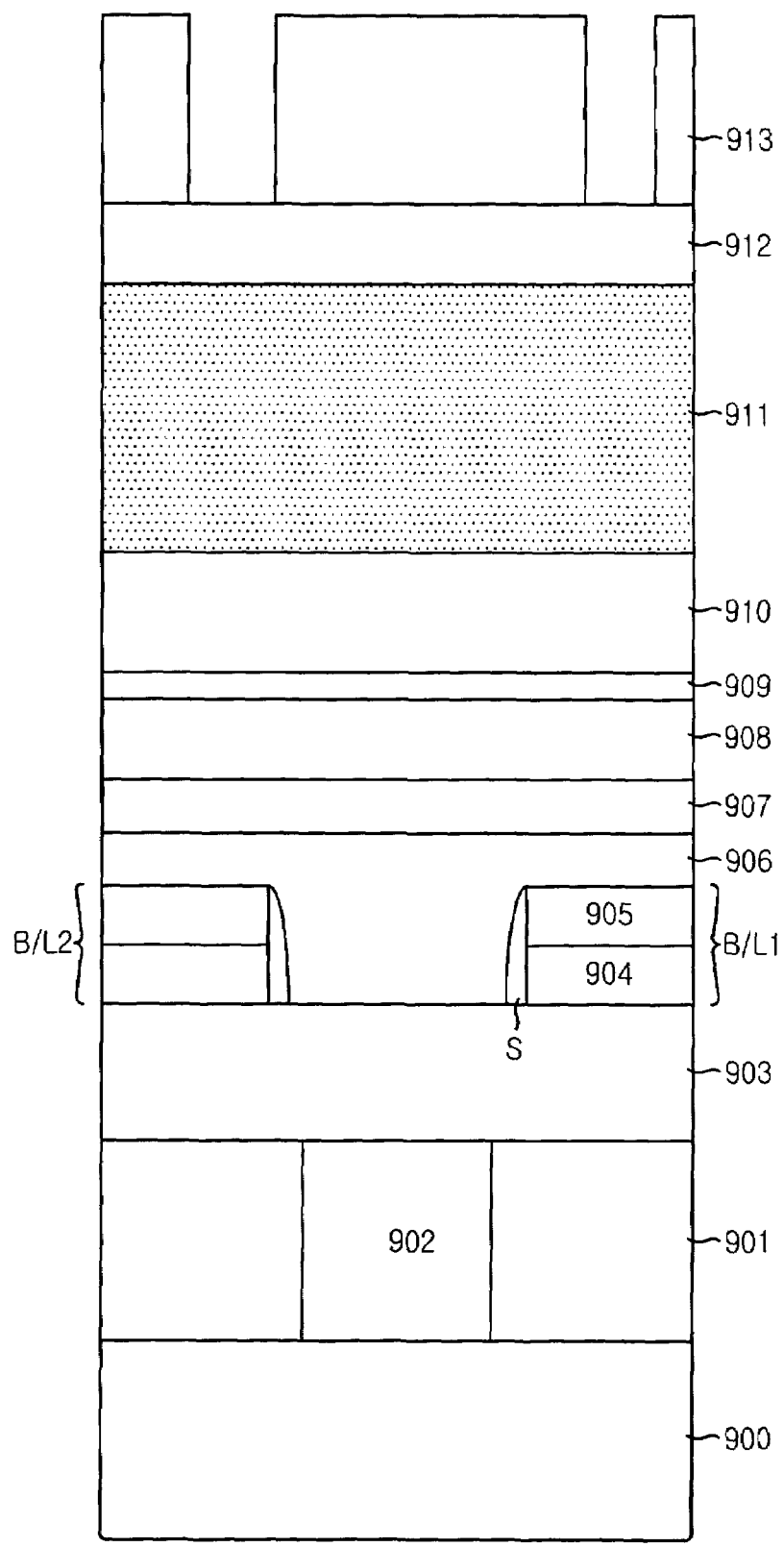
FIG. 12 is a cross-sectional view showing the semiconductor device taken along a line B-B' shown in FIG. 11.

FIG. 12 is a cross-sectional view showing the semiconductor device taken along a line B-B' shown in FIG. 11.

As shown, although the gate electrodes G1 and G2 are formed on a substrate 900, they are not shown in this drawing when viewed in a direction of the line B-B'. The gate electrodes G1 and G2 are encompassed by a first inter-layer insulation layer 901, and a contact plug 902 formed in a cell region is connected with impurity diffusion regions of the substrate 900 by passing through the first inter-layer insulation layer 901 and is planarized at the same level of a gate hard mask (not shown).

A second inter-layer insulation layer 903 is formed on the contact plug 902, and on top of the second inter-layer insulation layer 903, a plurality of bit lines B/L1 and B/L2 are formed. Although not illustrated, the bit lines B/L1 and B/L2 are electrically connected with the contact plug 902 by passing through the second inter-layer insulation layer 903. Each of the bit lines B/L1 and B/L2 includes a stack structure including a bit line conductive layer 904 and a bit line hard mask 905, and on sidewalls of the individual bit lines B/L1 and B/L2, spacers S are formed.

A third inter-layer insulation layer 906 is formed on the bit lines B/L1 and B/L2. A storage node hard mask layer 907 for preventing a bottom structure from being damaged during formation of a storage node and an oxide layer 908 are formed on the third inter-layer insulation layer 906. At this time, the oxide layer 908 is formed by employing a plasma enhanced chemical vapor deposition (PECVD) method with use of a material of tetraethylorthosilicate (TEOS). An etch stop layer 909 and an insulation layer 910 for use in a sacrificial hard mask are sequentially formed on the oxide layer 908. Herein, the insulation layer 910 is formed by employing nitride or oxide.

A tungsten layer 911 for use in a sacrificial hard mask, an ARC layer 912 and a photoresist pattern 913 are sequentially formed on the insulation layer 910. In case of the above described process for forming the storage node contact hole, there are typically observed problems of an insufficient overlay margin and a thick etch target for forming the storage node contact hole. However, the use of the tungsten-based sacrificial hard mask makes it possible to obtain desired patterns without deformation. The steps related to the sacrificial hard masks are identically performed as described in the other embodiments.

As described above, in accordance with the first to the fifth embodiments of the present invention, the sacrificial hard mask is a tungsten-based layer and an etch gas of the plasma containing $CHF_3$ gas which induces a chemical etching is used instead of a typically used N2 gas for etching etch target layers including the tungsten layer. These specific approaches provide an effect of obtaining good etch selectivity with respect to the photoresist pattern. Thus, it is possible to minimize deformation of the photoresist pattern during the formation of the tungsten-based sacrificial hard mask and as a result, there is further effect on prevention of pattern deformation caused by low etch selectivity of the photoresist pattern when ArF or $F_2$ photolithography is applied. Furthermore, since the plasma containing $O_2$ gas is used for etching an insulation layer for use in a hard mask, e.g., the nitride layer, the ID bias between the cell region and the peripheral region can be reduced. Additionally, these effects provide an advantage of improving yields of semiconductor devices.

The present application contains subject matter related to the Korean patent application No. KR 2004-0081383 and 2004-0113714, filed in the Korean Patent Office on Oct. 12, 2004 and on Dec. 28, 2004, respectively, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, comprising the steps of:
    forming a layer on an etch target layer, the etch target layer being an insulation layer;
    forming a photoresist pattern on the layer;
    etching the layer using a plasma containing $CHF_3$ gas by using the photoresist pattern as an etch mask to form a sacrificial hard mask; and
    etching the etch target layer by using at least the sacrificial hard mask as an etch mask, thereby obtaining a predetermined pattern, wherein the predetermined pattern includes a pattern for forming a contact hole.

2. The method of claim 1, wherein the predetermined pattern is one of a positive pattern and a negative pattern.

3. The method of claim 1, wherein the layer is formed by employing a material selected from the group consisting of tungsten (W), tungsten silicide ($WSi_x$) and tungsten nitride.

4. The method of claim 3, wherein at the step of forming the sacrificial hard mask, one gas selected from the group consisting of $NF_3$, $SF_6$ and $CF_4$ is used in addition to the $CHF_3$ gas.

5. A method for fabricating a semiconductor device, comprising the steps of:
    forming a conductive layer on a substrate;
    forming an insulation layer on the conductive layer;
    forming a tungsten-based layer on the insulation layer;
    forming a photoresist pattern on the tungsten-based layer;
    etching the tungsten-based layer by using the photoresist pattern as an etch mask to form a sacrificial hard mask;
    etching the insulation layer by using at least the sacrificial hard mask as an etch mask along with a plasma containing oxygen gas to form a hard mask; and
    etching the conductive layer by using at least the sacrificial hard mask as an etch mask to form a conductive pattern, wherein the conductive pattern includes a stack structure of the hard mask and the conductive layer.

6. The method of claim 5, wherein the insulation layer is one of a single layer of nitride, a multilayer of nitride and stacked layers of oxide and nitride.

7. The method of claim 5, wherein the insulation layer has a thickness ranging from approximately 1,500 Å to approximately 3,000 Å.

8. The method of claim 5, wherein the tungsten-based layer includes one of tungsten (W), tungsten silicide ($WSi_x$) and tungsten nitride (WN).

9. The method of claim 5, wherein the conductive pattern is one of a bit line, a word line and a metal line.

10. The method of claim 5, wherein the step of forming the photoresist pattern proceeds with one of ArF photolithography and $F_2$ photolithography.

11. The method of claim 5, wherein at the step of forming the sacrificial hard mask, a plasma containing $CHF_3$ gas is used.

12. The method of claim 11, wherein at the step of forming the sacrificial hard mask, one gas selected from the group consisting of $NF_3$, $SF_6$ and $CF_4$ is used in addition to the $CHF_3$ gas.

13. A method for fabricating a semiconductor device, comprising the steps of:
    forming a conductive layer on a substrate;
    forming an insulation layer on the conductive layer;

forming a tungsten-based layer on the insulation layer;

forming an anti-reflective coating layer on the tungsten-based layer;

forming a photoresist pattern on the anti-reflective coating layer;

etching the anti-reflective coating layer by using the photoresist pattern as an etch mask;

etching the tungsten-based layer by using at least the photoresist pattern as an etch mask to form a sacrificial hard mask etching the insulation layer using a plasma containing $O_2$ gas by using at least the sacrificial hard mask as an etch mask to form a hard mask; and etching the conductive layer by using at least the sacrificial hard mask as an etch mask to form a conductive pattern including a stack structure of the hard mask and the conductive layer.

14. The method of claim 13, wherein the insulation layer is one of a single layer of nitride, a multilayer of nitride and stacked layers of oxide and nitride.

15. The method of claim 13, wherein the insulation layer has a thickness ranging from approximately 1,500 Å to approximately 3,000 Å.

16. The method of claim 13, wherein the tungsten-based layer includes one of tungsten (W), tungsten silicide ($WSi_x$) and tungsten nitride (WN).

17. The method of claim 13, wherein at the step of forming the conductive pattern, the sacrificial hard mask is removed.

18. The method of claim 13, after the step of forming the conductive pattern, further including the step of removing the sacrificial hard mask.

19. The method of claim 13, wherein at the step of forming the sacrificial hard mask, a plasma containing $CHF_3$ gas is used.

20. The method of claim 19, wherein at the step of forming the sacrificial hard mask, one gas selected from the group consisting of $NF_3$, $SF_6$ and $CF_4$ is used in addition to the $CHF_3$ gas.

* * * * *